United States Patent [19]

Boys et al.

[11] Patent Number: 4,795,299
[45] Date of Patent: Jan. 3, 1989

[54] DIAL DEPOSITION AND PROCESSING APPARATUS

[75] Inventors: Donald R. Boys, Cupertino; Walter E. Graves, San Jose, both of Calif.

[73] Assignee: Genus, Inc., Mountain View, Calif.

[21] Appl. No.: 38,540

[22] Filed: Apr. 15, 1987

[51] Int. Cl.⁴ ............................................. C23C 13/08
[52] U.S. Cl. .................................... 414/217; 118/500; 118/719; 118/730; 204/298; 414/225; 414/417
[58] Field of Search .............. 118/426, 500, 729, 730; 414/217, 221, 222, 225, 590, 744 A, 417; 204/298

[56] References Cited

U.S. PATENT DOCUMENTS

| | | | |
|---|---|---|---|
| 3,648,653 | 3/1972 | Vehse | 118/500 X |
| 4,311,427 | 1/1982 | Coad et al. | 414/225 X |
| 4,313,815 | 2/1982 | Graves, Jr. et al. | 204/298 |
| 4,492,512 | 1/1985 | Mink | 414/744 A |
| 4,500,407 | 2/1985 | Boys et al. | 414/222 X |
| 4,569,624 | 2/1986 | Noda et al. | 414/751 X |
| 4,647,266 | 3/1987 | Turner et al. | 414/417 X |

FOREIGN PATENT DOCUMENTS

| | | | |
|---|---|---|---|
| 699583 | 11/1979 | U.S.S.R. | 118/426 |
| 2033865 | 5/1980 | United Kingdom | 118/426 |

*Primary Examiner*—Robert J. Spar
*Assistant Examiner*—Stuart J. Millman
*Attorney, Agent, or Firm*—Joseph H. Smith

[57] ABSTRACT

A system for moving and processing workpieces includes individual stations isolated from one another and from a main chamber by seals formed by a transport mechanism. Workpieces are moved in a queue in a circular pattern, by a dial turret operated by a bell-crank and a Geneva mechanism. Stations seal to the baseplate from below, and a vacuum chamber encloses the turret assembly which operates on a post through a center hole in the baseplate. Workpieces loaded to one depended chamber are withdrawn from chambers and inserted into next chambers in a circular pattern, passing through the main chamber with each transfer, and ending back in the chamber where they were loaded. In an alternative embodiment passages between the main chamber and each individual chamber have valves allowing processing to take place without carriers attached to the turret being in the processing chambers. In another embodiment a single radial arm transfers one workpiece at a time, indexing in either direction, allowing workpieces withdrawn from one chamber to be placed in any other chamber. In other alternative embodiments automatic equipment for loading and unloading workpieces is provided with a single cassette airlock and with in-line air locking for cassettes. Provision is made for a wide variety of processes to be performed, and processing can be from one or both sides of a workpiece.

33 Claims, 18 Drawing Sheets

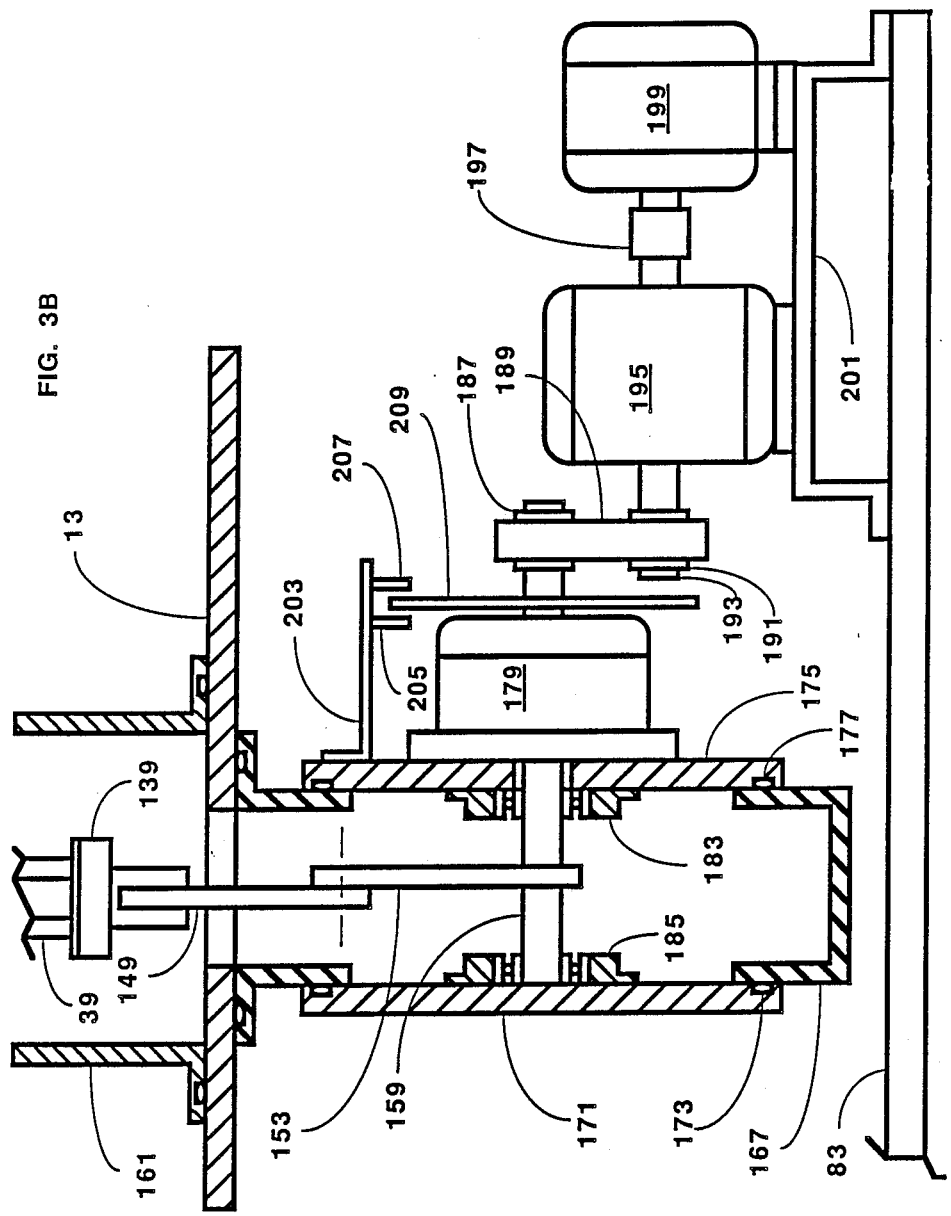

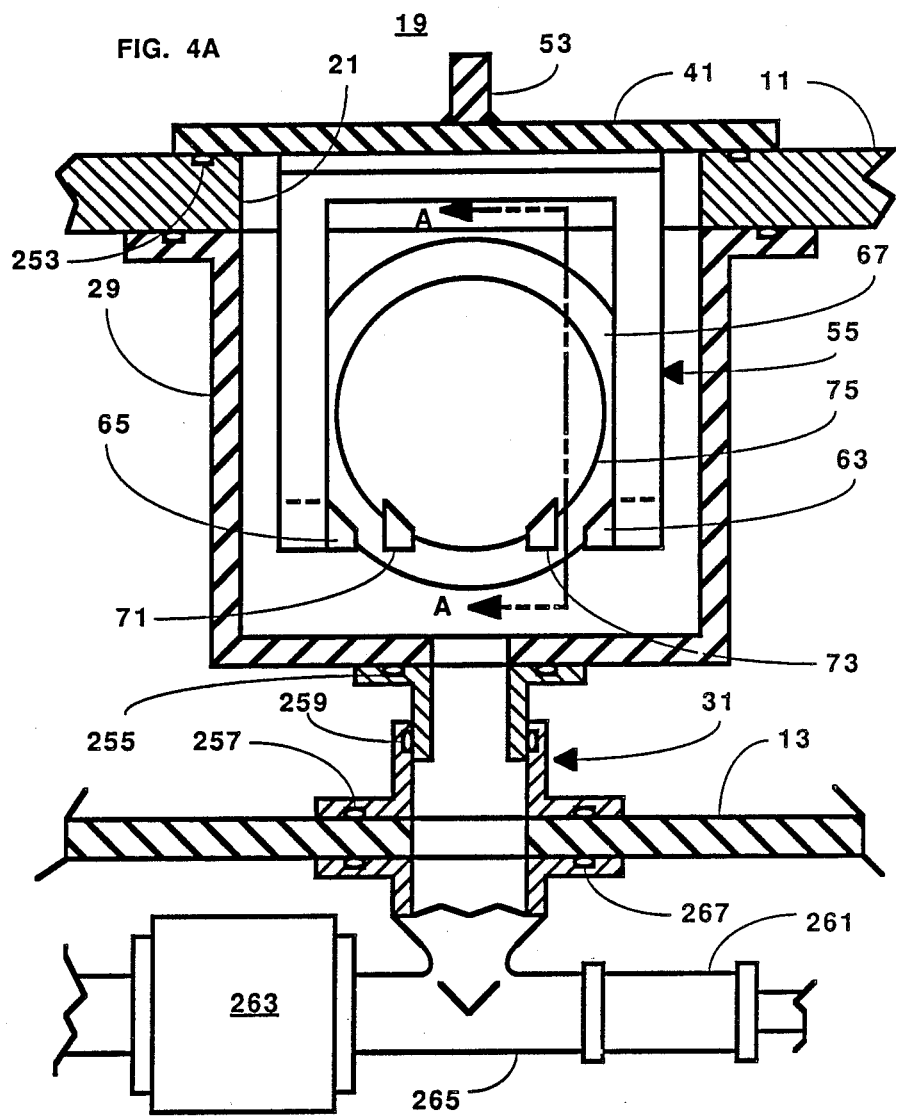

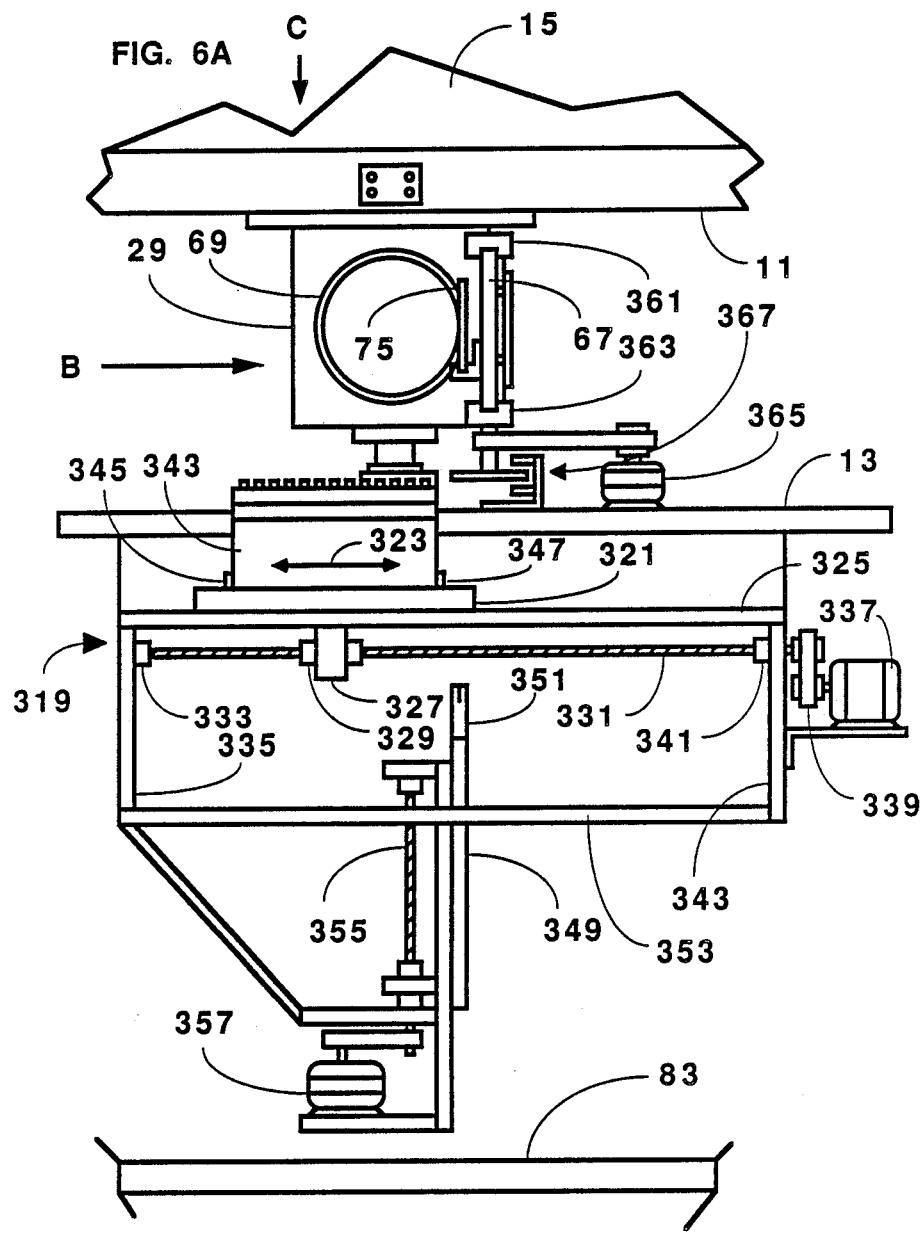

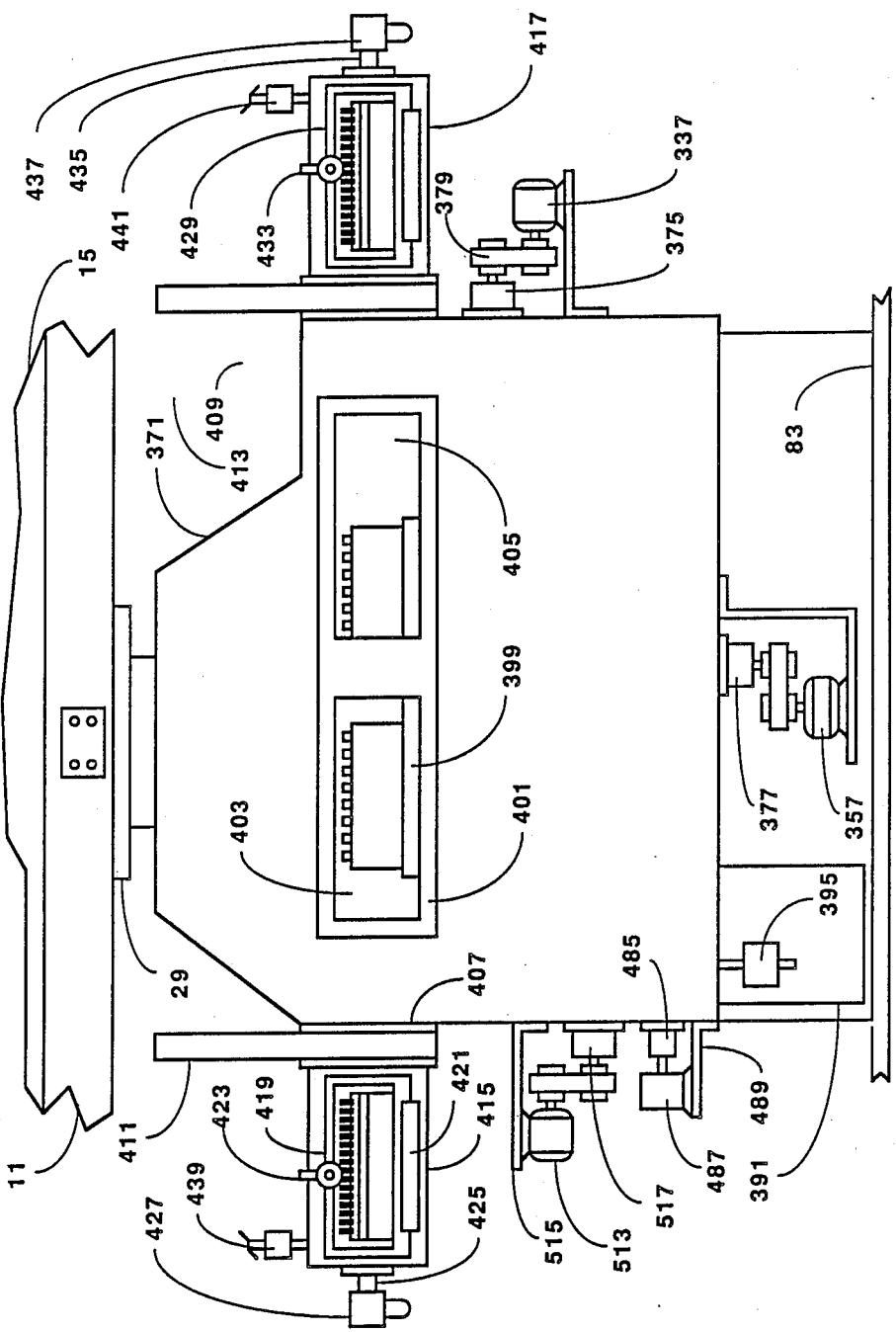

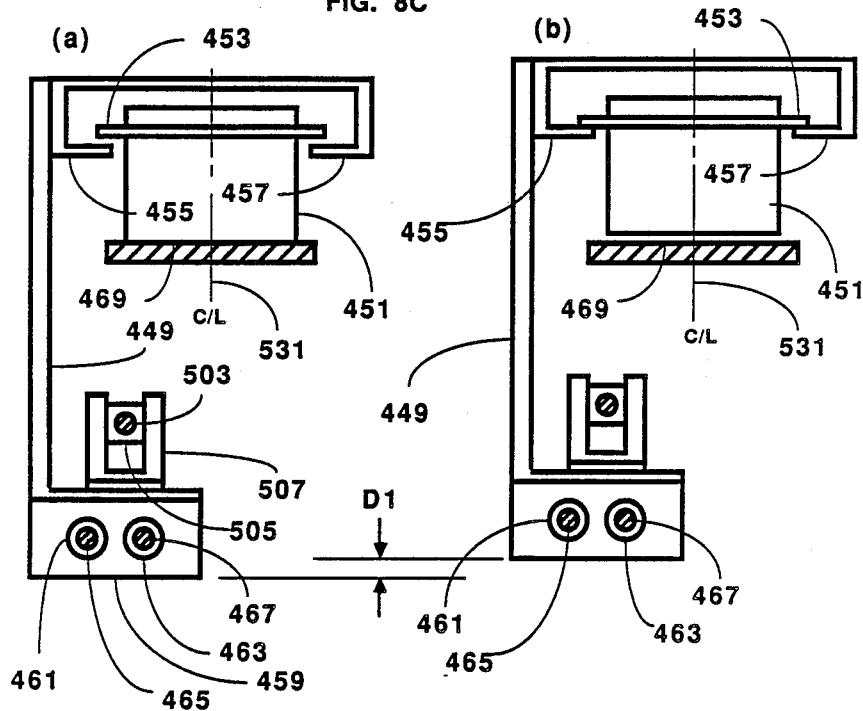
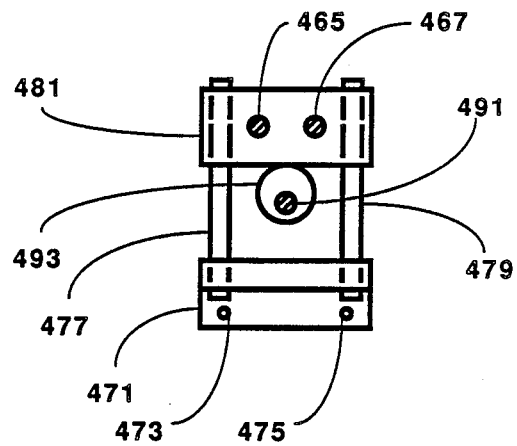

DIAL DEPOSITION AND PROCESSING APPARATUS

FIELD OF THE INVENTION

This invention is in the field of vacuum processing apparatus and relates particularly to vacuum machines designed to move substrates one-at-a-time through a sequence of vacuum processes or process steps.

BACKGROUND OF THE INVENTION

Over a period of decades vacuum processes have become increasingly important in the manufacture of many products. As an example, the manufacture of integrated circuits is largely a process of depositing and selectively removing thin layers of pure materials, and many of the process steps in that manufacture are necessarily performed in a vacuum environment. Materials such as tungsten silicide are deposited on wafer slices by low pressure chemical vapor deposition (LPCVD) in which the tungsten and the silicon are derived from gases bearing metal and silicon in a process performed under partial vacuum. Aluminum alloys are deposited by evaporation and condensation and also by plasma sputtering processes for forming interconnect circuitry on integrated circuits. These latter two deposition processes are are known in the art as physical vapor deposition (PVD) processes, and are performed under relatively higher vacuum (lower pressure) conditions than LPCVD processes. There are numerous support processes such as etch cleaning of wafer surfaces, pre-heating, and annealing that are also preferably performed in a vacuum environment in the manufacture of integrated circuits. Plasma etching processes used for removing selected portions of deposited films to form patterns for circuitry are also often performed in a vacuum.

Similar vacuum processes to those used in integrated circuit manufacture are also used in the manufacture of magnetic memory disks, magneto-optical memory disks, and optical memory disks such as the increasingly popular digital compact disks used in the music recording industry. Integrated circuits and memory disks are two imporant products among many in which processes performed under vacuum environment are extensively used. Moreover, in both integrated circuit manufacture and memory disk manufacture, the substrates used form a general class of thin, flat blanks, often round, and most usually of a size falling within an approximate diameter of 25 cm or less.

To perform a vacuum process on a workpiece, it is necessary to place the workpiece in a leak-free enclosure and to remove the air from the enclosure by the use of one or more vacuum pumps. Equipment for performing the desired process on a workpiece, such as a heated crucible for evaporating aluminum, may be placed in the same enclosure and activated after sufficient air is removed to allow the process to take place without contamination. In some cases particular process gases might be introduced after air removal, such as in chemical vapor deposition processes and plasma-sputtering processes.

Early machines for performing vacuum processes were based on a single vacuum enclosure, also often called a chamber. The chamber would typically have a single door with a seal such as an O-ring, vacuum pumps for exhausting the chamber would be connected to the chamber by pipes with sealed joints and valves designed to operate in vacuum systems without leaking, and there would be fixturing for holding workpieces in relation to processing equipment also in the enclosure. As an example, there might be an electron beam device for melting and evaporating a charge of aluminum, and fixturing in the chamber would be arranged so that workpieces placed on the fixturing would have surfaces to be coated with aluminum facing an evaporation crucible of the electron beam device. Utilities like electric power and cooling water for the processing equipment would pass across the chamber wall (the vacuum boundary) by means of especially designed feedthrough devices to prevent leakage into the vacuum enclosure.

A typical processing cycle for a single chamber machine is as follows:

1. With the access door open, one or more workpieces to be processed are placed on the fixturing in the enclosure.
2. The access door is closed and latched.
3. Valves are opened in a planned sequence to connect vacuum pumps to the enclosure volume to remove the air in the enclosure and the vacuum level is monitored with one or more vacuum gauges until the level of vacuum is attained that is necessary for the process.
4. Process equipment in the chamber is activated and the process is monitored until complete, then process equipment is de-activated.
5. A vent valve is opened to allow air back into the enclosure until the internal pressure equals one atmosphere, after which the door is opened and the processed workpieces are removed.
6. New unprocessed workpieces are placed on the fixturing and the cycle begins again.

Single chamber machines such as described above for processing a plurality of workpieces in a single processing cycle are called "batch" systems, because a bath of workpieces is processed with each machine cycle. The fixturing for holding the workpieces is usually designed to maximize the number of workpieces that can be processed in a batch cycle, and the fixturing often is manipulated to move the workpieces relative to the process equipment during processing for, among other reasons, increasing the uniformity of processing. Mechanical motion for such manipulation passes through a chamber wall by means of especially designed mechanical feedthrough devices.

One of the first improvements developed for such machines was automatic sequencing of the steps in the machine cycle. Programmable sequencers were provided that would accept signals from monitoring equipment, provide signals to open and close valves, start and stop fixture manipulation, activate processing equipment, and so forth, so that manual intervention would seldom be necessary from loading of unprocessed workpieces to unloading of finished work.

The motivation for improvements in vacuum processing equipment are often similar to those encountered for improvements in other kinds of equipment. For example, among these motivations is the desire for a higher quality process resulting in a higher quality product from the workpieces processed. Also, efficiency is important, so that one has the ability to do more processing in less time, reducing the processing cost of workpieces. Also many times a new product requires processing in some manner that can't be done or can't be done well in existing equipment.

Typically, however, even if there are several motivations for improvement, there is usually a primary factor. Generally the factor has some relationship to a particular problem or limitation that has been encountered in the past. In that regard, two major limitations have become apparent with both manually cycled and automatically cycled batch machines for vacuum processing. First, in the overall machine cycle the functions of exhausting the vacuum processing chambers, venting the enclosure after processing, loading unprocessed workpieces and unloading finished workpieces are all serial in the cycle chronology. Actual processing of the workpieces is accomplished for only a fraction of the total cycle time. Second, there are serious quality problems resulting from the fact that the processing equipment and enclosure are exposed to atmosphere every cycle. Among these problems is the fact that the process has to be re-initiated for each new batch, and repeatability of process for batch to batch may vary widely. Also, most vacuum processes result in a residue of some kind being deposited on fixtures and internal walls, and such residue incorporates air molecules and water at atmospheric pressure which are released very slowly under vacuum, a phenomenon known as "outgassing". Each time a processing chamber is exposed to atmosphere, the subsequent pumpdown proceeds a little more slowly, so there is a gradual increase, cycle to cycle, in the total cycle time. There may also be a gradual deterioration in the quality of work produced due to contamination effects of outgassing. The workpieces also trap water vapor and air and contribute to outgassing during pumpdown and processing.

An improvement known as "air-locking" was developed to combat the difficulties listed above. Air-locking is a procedure very well known in the art of vacuum processing for introducing workpieces into a vacuum chamber and removing workpieces from a vacuum chamber without substantially disturbing the vacuum environment in the chamber.

An air-locked system has at least one vacuum chamber known as an air-lock attached to the main processing chamber and connected by a sealable opening. The sealable opening between the chambers is operable from outside the chambers. Another sealable opening similar to the first communicates from outside the chambers into the air-lock. The air-lock additionally has a valved vacuum pumping system of at least one vacuum pump which is independent of the pumping system for the processing chamber, and transport equipment for moving workpieces into and out of the process chamber through the sealable opening between the two. The transport equipment is also operable from outside the chambers like the sealable opening between the chambers. A valve known as a "vent valve" or "back-to-air" valve is also necessary, communicating from outside into the air-lock.

A typical system cycle for air-locked system described above proceeds as follows:

1. Air-Lock Venting - While processing proceeds on workpieces in the process chamber, and with the sealable opening between the chambers closed and sealed, the vent valve is opened, admitting air into the air-lock until the pressure equalizes with outside air pressure.

2. Load-Unload - The sealable opening from outside into the air-lock is unsealed and opened. Processed workpieces in the air-lock are removed and unprocessed workpieces are placed into the air-lock and positioned on the internal transport.

3. Air-Lock Pumpdown - The sealable opening to the outside of the air-lock is closed, the vent valve is closed, and valving to the air-lock pumping system is opened to exhaust air from the air-lock. Pumping proceeds until a vacuum level is attained which experience has shown to be suitable for "crossover."

4. Crossover - There are two necessary conditions for "crossover". The vacuum level in the air-lock must be such that contamination of the process chamber will not take place when the sealable opening between the two chambers is opened, and the process on the batch of workpieces in the process chamber must be complete. The process equipment is deactivated, the sealable opening between the chambers is opened (from outside the chambers), the internal transport is activated so that the batch of finished workpieces in the process chamber moves into the air-lock and the batch of unprocessed workpieces in the air-lock moves into the process chamber. The sealable opening between the two chambers is closed and sealed, and the process is activated in the process chamber for the new batch.

After cross-over and reactivation of the process, the air-lock can be vented again starting a new cycle. For each cycle completed, a batch of finished workpieces is removed from the machine.

Air locking can be performed with a variety of geometries. For instance, if two air-lock chambers are used, one on each side of a processing chamber, each with a sealable opening to the process chamber and another to the outside, a system is created in which workpieces may be introduced from one side through one of the air-lock chambers, moved through the process chamber, and removed from the other side through the second air-lock chamber. Such a system is called an in-line air-locked system. Additionally, a process chamber may be extended including internal transport devices so that workpieces may be moved between sequential process stations in the process chamber, and a plurality of processes may be performed on workpieces. The arrangement also allows continuous processing. In such a queuing system the processes being performed on the workpieces are performed simultaneously with an air lock cycle, (ie. the various processes are chronologically parallel) all on separate batches of workpieces, so each cycle still produces a finished batch, now with several processes performed; and the process chamber remains under vacuum environment at all times in operation.

A further innovation substitutes a series of individual process chambers with sealable openings between each of the chambers for the processing systems having in-line process stations. With this arrangement processes that are incompatible in a single chamber system can be performed, still with air-locks introducing workpieces at one point and removing them at another.

The advantages of air locking are several. For example, the number of workpieces processed per unit time can be increased because pumping and material handling functions can be done while processing continues. Serial processing can be accomplished, even with processes that are not compatible.

In the evolution of automated, air-locked vacuum processing systems, the specific design details of systems developed are determined by the workpieces to be processed and the nature of the processes to be performed. A system for coating architectural glass sheets which coatings for optical filtering is considerably different than a system for applying magnetic coatings to aluminum disks for computer magnetic memory storage media. The differences are in such details as the size of the chambers, the kinds of materials used for coating, the fixturing for the workpieces, and the nature of internal transport devices and carriers, among others. There is such commonality, however, in the principles of air locking and vacuum practice.

One of the motivations for innovation in design of vacuum processing equipment mentioned above was an inability to adequately process new products. There have been several product developments in the past ten years that have fallen into that category. The ever decreasing dimensions of integrated circuit components to improve device density have been on such driving force. The development of thin-film hard disks has been another. Developments of magneto-optical memory storage technologies promises to continue the trend. As part of these developments, it was found that adequate processing of many such products required, among other things, better base vacuum ability than was possible with available equipment. Higher purity process gases, higher material purity, new processing capabilities, more repeatable process control, and more flexibility in process type and sequence were other things found to be necessary to adequately process some new products and new developments of older products.

One development intended to help meet the need of demanding new product requirements was one-by-one workpiece processing. Machines were developed to move single substrates in a queuing fashion through air-locks and processing stations rather than moving carriers and fixturing with multiple substrates.

One-by-one processing provided several needed advantages. Among them were:

1. Smaller System Space Requirements - Many of the new product developments requiring new system abilities also required external conditions such as "clean rooms" that provided controlled and filtered air to remove such contaminants as dust particles. Rooms to provide the special external environment are expensive, and smaller system size helps to hold down costs. The smaller systems are also generally more accessible for servicing.

2. Elimination of Carriers and Fixturing - One-by-one design generally made obsolete the large carriers and fixturing that were used in air-locked batch systems for moving large numbers of workpieces through the system. Such carriers and fixturing, exposed to atmosphere after each cycle through a system, are a vehicle for injecting contaminants through air locks and into processing chambers. Their elimination allowed higher purity processes by virtue of lower chamber base vacuum levels.

3. More Uniform and Repeatable Process - Even with fixturing designed to manipulate workpieces relative to processing equipment as an aid to uniform processing, not every workpiece would have the same exposure and treatment as every other in a bath process. One-by-one processing ensured that each substrate could be oriented to the processing equipment in exactly the geometry and for exactly the time as each other substrate.

The development of one-by-one processing machines did not make obsolete the older automated batch and in-line batch machines, which continue to be useful for processing that was not so demanding. A good example of a large in-line, automated air-locked system is that described in U.S. Pat. No. 4,313,815. Machines of that kind are extensively used for coating large architectural glass blanks, automotive parts, and other consumer products, among other things. A good example of a one-by-one processing system is that described by U.S. Pat. No. 4,311,427, "Wafer Transfer System" issued Jan. 19, 1982 to G. L. Coad, R. H. Shaw and M. A. Hutchinson, which is a system that was developed for coating primarily aluminum alloy films on wafer slices in integrated circuit production. This latter system is a load-locked system with a common vacuum processing chamber, and does not allow isolated performance of otherwise incompatible processes.

An example of a system designed to operate one-by-one and to also provide isolated process stations is that described in U.S. Pat. No. 4,500,407, "Disk Or Wafer Handling And Coating System" issued Feb. 19, 1985 to Donald R. Boys and Walter E. Graves. The present invention comprises a system of that general kind, i.e. one-by-one material handling and processing, air-locked, and with isolatable process stations.

The evolution of vacuum processing systems in general has been a history of increased complexity and cost. The developments of systems with air locks, multiple process stations and isolatable process stations has required the addition of chambers; provision of multiple sets of process equipment; a proliferation of vacuum pumps, manifolding and valves; and complicated material handling equipment. This general trend has affected both air-locked batch systems and one-by-one processing systems. In the period from about 1970 to 1975 batch processing systems sold in a range of from about $50,000 to about $150,000. One-by-one multiple processing systems today generally sell from about $500,000 to $1,500,000, an increase by an order of magnitude. Large in-line batch systems are even higher priced, with installations costing $5 million and more.

Some of the cost increase is simply inflation, but most is due to the increase in complexity and the proliferation of required equipment. This same proliferation has other negative effects, one of which is a considerable deterioration in reliability. With any mechanical or electrical device there is a finite (though often unknown) probability of failure. Addition of mechanical and electrical devices in a system design can only have the effect of decreasing the reliability of the overall system. The result of evolution in design from single chamber manually operated systems to multi-chamber automated systems with multiple processes and multiple pumping systems has resulted in a situation where such systems have a very poor reputation for reliability, and failures in operation are commonplace.

Earlier, in describing the evolution of vacuum processing systems, it was stated that internal sealable openings between chambers through which workpieces must pass from chamber to chamber, must be operated from outside the vacuum chambers. Also, internal transfer systems for moving workpieces from place to place inside such a system must be operated and driven from outside the vacuum chambers. One reason for this is that conventional motive devices such as electrical motors, air cylinders, hydraulic linear and rotary activators, and so forth, are not operable within or compatible with the vacuum environments inside such a system. The usual accomodation is to place the motive device outside the vacuum chambers and to pass motion and power across the chamber wall into the vacuum environment by use of a mechanical motion feedthrough. If the needed motion is rotary, there is a broad selection of rotary motion feedthroughs available to designers to pass the rotary motion and power across the vacuum boundary without leakage, such as the devices designed and sold by the Ferrafluidics Corporation. If the needed motive force is linear, such as provided by the shaft of an air cylinder, sealing is most usually accomplished at the vacuum boundary by welded metal bellows attached at one end of the air cylinder shaft and at the other to the vacuum boundary wall, usually with static seal O-rings, and usually inside the vacuum chamber. Whether rotary motion or linear motion, the sealing devices and methods are complicated, expensive, and prone to failure.

Wherever mechanical feedthroughs have to be used in a vacuum processing system new potentials for vacuum leaks are created. The same is true in the use of multiple vacuum pumps and manifolds. Every additional pump, every additional valve and every additional joint in vacuum manifolding is another place a leak may appear and cause a contamination and maintenance problem. Vacuum leaks are often very difficult to detect and correct, so the fewer sealable joints and feedthrough devices that have to be used in a system the more likely the system is to be reliable in use. The system described by U.S. Pat. No. 4,500,407, for example, has at least eleven mechanical motive feedthrough devices and many more potential leak sites that would be counted in a single chamber batch system of several years ago.

In systems handling workpieces in a one-by-one queuing fashion through air-locks and multiple process chambers, mechanical devices are needed to pick up each workpiece and move it from one position to the next in queue. Each such movement represents an opportunity to lose control of a workpiece, and great care must be taken in design to insure the reliability of material handling devices. A system such as described in U.S. Pat. No. 4,500,407 may have twenty or more transfers of control for each workpiece between the load and the unload end of the queue.

There are many kinds of vacuum processes performed on products like semiconductor IC wafers and thin-film computer memory disks. These include processes for depositing films and processes for removing films as well as support processes such as pre-heating and post-heating of workpieces. The first multiple process machines developed for one-by-one processing were fairly limited in process flexibility. The system of U.S. Pat. No. 4,311,427, for instance, performs all processes in a single chamber with a common pumping system. The main process is sputtering of aluminum/silicon alloy for interconnect layers. Support processes in the same chamber are ion-etch bombardment to surface clean wafers prior to coating with aluminum and pre-heating of the wafer as an aid in controlling the crystal grain structure of the deposited aluminum film for various reasons. Fueled primarily by product development it has become desireable to isolate stations so that processes requiring differing vacuum levels, process gases, and other functional differences might be performed sequentially on workpieces. Many of the desireable processes are plasma processes such as sputtering and ion-etching; and in at least some variations of such processes it is desireable that the workpiece be electrically biased. The biasing in some cases may be radio-frequency (RF) alternating potential, and in other cases direct current (DC). To do such biasing has long been a source of equipment functional design difficulty in multiple process systems. The difficulty arises from the fact that it is necessary to transport a workpiece by some mechanical device and it is also necessary to isolate the biasing of a workpiece to the particular station where biased process is to occur. Some systems insert a workpiece into an isolatable process chamber and maintain the workpiece during processing on the member used to accomplish the insertion. This requires electrical isolation of the support/insertion member so that bias potential does not travel back into the transport equipment outside the particular process chamber, and an electrical contact to be made to the workpiece or the support for the workpiece within the chamber. The contact must be broken each time a workpiece exits and re-established each time a workpiece enters the process station. Such contact devices are inefficient and unreliable. It has generally been found that it is better from a processing viewpoint to place the workpiece on a dedicated biasable pedestal in the process chamber, but to do so requires a "pick-and-place" material handling operation by which a workpiece may be placed on such a pedestal by a placement device and the placement device moved away from the pedestal before process is initiated. After processing, the device must retrieve the workpiece and exit the process chamber. A unique and reliable way to "pick-and-place", allowing biased processing on a fixed pedestal has long been needed.

With the development of one-by-one systems with isolatable processing stations there often remain design limitations on the range of process types that might be performed. It might be desired, for instance, to perform a reactive etch process in one station to remove oxide layers on a metal surface before a deposition process in another station. The deposition process might be a physical deposition, such as sputtering, or a chemical process such as low pressure CVD. This is but a single example of a very large range of processes and process sequences that might be desireable. If a system layout and design is such that the connection and placement of the pump and gas supplies is impossible or very difficult, then the usefulness of such a system is limited. In certain processes the process gases may be toxic or corrosive or both, and it is necessary to remotely place pumps and provide exhaust for "burn boxes" r other means of handling such effluent materials. A system design must take all this into account.

Systems for one-by-one isolated processing usually have a common chamber or main chamber, sometimes called a transport chamber, through which workpieces are moved from one process station to another. In such systems, much of the workpiece transport equipment operates within this main chamber enclosure. The fact that such equipment is in a vacuum enclosure implies inaccessibility, and in present day systems cleaning and other service and maintenance for the workpiece transport parts is tedious, difficult and time consuming.

In a one-by-one sequential processing system the cycle time, i.e. the time between introduction of one workpiece to the system and introduction of the next workpiece, during which time a workpiece is also removed, having experienced all the sequential processes, is necessarily the time required for the longest duration single process of the several processes being performed. With the use of single chamber load-locks the pumping time for the load-lock cannot be longer than this cycle time, and in fact is less by the time required to vent the load-lock, remove a processes workpiece, and insert a new workpiece to be processed. In many cases the time is too short to ensure an adequate pumpdown due to outgassing characteristics of surfaces in the load-lock chamber and, in particular, the surfaces of the new workpiece inserted each cycle. As an example, in a one-by-one sequential processing system for depositing aluminum/silicon material for interconnect circuitry on integrated circuits the cycle time with one deposition station is typically about sixty seconds. The material handling functions and venting of the load-lock require typically requires about thirty seconds; so the actual pumping time on the load-lock is no more than thirty seconds. Even with a very small volume load-lock chamber, for example having just enough volume to enclose the wafer workpiece and mounting mechanism, this is not long enough to achieve a vacuum level close to the usual operating level of the main chamber or processing chambers. It is typical for a main transport chamber in such a system to operate in a $10^{-6}$ Torr pressure range, and for such a lock chamber to be opened into the main transport chamber when the pressure in the lock chamber is in the $10^{-4}$ Torr range. The pressure in the lock in this situation is 100 times the pressure in the main transport chamber. The newly introduced workpieces become a vehicle for introducing contamination into the machine. An arrangement allowing one-by-one isolateable processing, but also divorcing the air-lock operation from the system process cycle would be desireable, to allow time for contaminants to be pumped away before processing.

Accordingly it is an object of the present invention to provide a system with one-by-one handling capability and isolateable processing station at a greatly decreased level of mechanical complexity than has heretofore been available.

It is another object of the invention to provide a system that can be produced at a reduced cost.

It is a further object of the invention to provide a system the will exhibit increased reliability as a result of decreased complexity.

It is another object of the invention to provide a system with a plurality of isolateable processing stations without increasing the number of dynamic mechanical feedthrough devices associated with workpiece transport.

It is also an object of the invention to reduce the potential vacuum leak sites such as those associated with dynamic mechanical feedthrough devices.

It is a further object of the invention to reduce to a minimum the number of changes in control required to move workpieces through air-locking and sequentially through a plurality of processing stations.

It is another object of the invention to provide a capability to place a workpiece onto a dedicated pedestal in a processing station without supporting the workpiece during processing on the member used for insertion; and at the same time, not requiring actuation of a device or devices for gripping and/or releasing the workpiece. This particular capability allows dedicated processing pedestals to be used with static feedthroughs for electrical biasing not requiring making or breaking electrical contact with each process cycle, at the same time retaining mechanical simplicity.

It is an additional object of the invention to provide a one-by-one isolateable processing system maximizing process flexibility by making it possible to use all the known types of vacuum pumps, and additionally to remove the pumps from the system if needed.

It is a further object to provide a system in which all of the processing stations can be serviced off-line, and additionally the main transport chamber can be easily and routinely accessed for service and maintenance.

It is also an object of the invention in an alternative embodiment to provide an ability to do one-by-one isolateable processing of workpieces and at the same time to do a much longer pumping cycle on incoming workpieces than is possible with a single workpiece load-lock.

SUMMARY OF THE INVENTION

In accordance with preferred embodiments of the invention, a system is provided for moving and processing workpieces having a baseplate element for providing a fixed horizontal framing element for the system, the baseplate having a central hole therethrough and a plurality of vertical passages therethrough with the vertical passages arranged at repeating intervals on the circumference of a circle having its center located within the hole. The baseplate element has a substantially flat upper surface in the proximity of the vertical passages. A plurality of individual workstations are attached to the bottom surface of the baseplate, with one station for each vertical passageway, and each station having an opening for receiving a workpiece which is aligned with its respective vertical passageway. A vertical center post extends above the upper surface of the baseplate with the center of the center post at the center of th circle defined by the vertical passages. An important feature of the system is a turret assembly which is fixedly attached to the center post and rotatable therewith, the turret assembly for holding at least one workpiece, and preferably a plurality of workpieces at a radial distance from the center of the center post that is equal to the radius of the circle defined by the vertical passages. An elevator system is used for moving the center post and turret means up and down between an uppermost position and a lowermost position. The lowermost position is located such that a workpiece would be fully inserted through any one of the vertical passages and into a corresponding one of the individual stations, and the uppermost position is located such that a workpiece would be fully withdrawn from any one of the vertical passages and out of the corresponding individual station. An indexing system is used to rotate the center post and turret assembly through angular elements which are multiples of the angular increment between the vertical passages relative to the center post. Thus as the center post and turret are lifted, indexed, and lowered, a workpiece is moved from one workstation to another, and in the case of a plurality of workpieces, the workpieces are moved simultaneously and incrementally from one workstation to another. A dome is sealed to the baseplate forming a main pressure vessel enclosing the center post and the turret assembly.

Also in the preferred mode, a pumping system is provided to control the pressure inside the pressure vessel and inside the workstations. Typically the upper baseplate is parallel to and spaced apart from a lower baseplate, with the plurality of individual workstations being located between the two baseplates. Each workstation has a scond sealable opening beneath it to which a sealed manifold connection is made to the lower baseplate. The lower baseplate is horizontal like the upper one, and spaced apart vertically from a floor plate by spacer legs such that high vacuum pumps with isolation valves may depend from the lower baseplate, above the floorplate, and directly below each individual workstation.

Although the pumping system can be selected to provide a positive pressure relative to the atmosphere if so desired, in the preferred mode, the pumping system is used to evacuate the pressure vessel and workstations creating a vacuum therein in which to perform various kinds of deposition operations, for example CVD or sputtering or both. In a preferred arrangement, the turret assembly includes a frame for attaching the turret assembly to the center post and a plurality of carrier assemblies attached to the frame and depending therefrom. Each of the carrier assemblies is configured for holding a workpiece having a substantially planar shape in a substantially vertical orientation at the same radius as the vertical passages, and spaced apart angularly the same as the workstations. Typically, one of the workstations serves as an air-lock for the entrance and exit of workpieces from the system, although a separate external air-lock could be provided if so desired. In the former implementation, the preferred airlock station has a sealable door opening to the outside of the pressure vessel, and the pumping system includes a valved pumping and venting arrangement. The turret and carrier assemblies are so configured so that when they are in the lowermost position, the individual workstations are sealed from the pressure vessel. Thus when the turret assembly is in the down position, the air-lock can be vented and the sealable door opened, permitting the loading or unloading of workpieces. In the preferred mode, the inside of the sealable door of the airlock has a cradle for supporting a workpiece, and the cradle has two grooved supports spaced apart at a distance less than the diameter of a workpiece. With the door open, a workpiece can be placed in the cradle and will be supported in a vertical orientation. When the air-lock door is closed, the supported workpiece moves into the plane of the carrier assembly that is depended from the frame of the turret assembly. The carrier assembly is provided with two spaced apart supports typically with a spacing greater than the spacing of the two grooved supports on the cradle, but less than the diameter of the workpiece. With the air-lock door closed, the loaded workpiece is supported on the door cradle just above the supports of the carrier assembly. As the turret assembly is raised, after the air-lock has been exhausted, the carrier assembly supports engage the workpiece and lift it off the grooved supports of the load-lock door. Then the carrier assembly supports carry the workpiece to the next workstation for processing as the turret assembly is indexed and lowered. The reverse of this process can be used to unload a workpiece from the system through the load-lock. Hence, when a workpiece is lowered into the load-lock from the last workstation, the finished workpiece is unloaded onto the load-lock door and can be removed. Another workpiece can be placed on the door and the process continued, so that a workpiece can be loaded and one can be unloaded each cycle to provide a continuous sequence of processing.

In an alternative embodiment a vacuum tight enclosure is provided sealing to the door face of the air-lock chamber, the added enclosure having another sealable door opening to the outside, a movable pedestal within for supporting a cassette of workpieces, and mechanisms for automatically moving workpieces to and from the cradle on the air-lock door. The added enclosure is an air-lock into which an entire cassette of workpieces may be loaded. In this embodiment the air-lock cycle is divorced from the process cycle, and pumping can be done on the added air-lock for a time that is a multiple of the longest process time by about the number of workpieces in the cassette. A process interruption occurs each time a finished cassette is to be removed and a new one inserted.

In yet another embodiment two air-locks are provided communicating with the added enclosure so that cassettes can be introduced through a first cassette air-lock and removed through a second cassette air-lock. In this alternative maximum outgassing time is achieved, and processing cassette-to-cassette can proceed uninterrupted. By virtue of the fact that one point of entry-exit for the dial is used, the load/unload arrangement can interface to a clean-room wall with the rest of the system outside the controlled load-unload area. This can be true with a single load-lock, a cassette load-lock, or an in-line cassette load-lock arrangement.

The benefits of the above design are many. For example: all material transport within the system, from the air-lock door back to the air-lock door can be accomplished by movement fed into the vacuum environment through only two rotary feedthroughs. There is no requirement for linear motion feedthroughs and no requirement for bellows seals which are subject to fatigue failure. Furthermore, the number of such feedthroughs is not influenced by the number of depended process stations. A two station system requires two rotary feedthroughs and a ten station system capable of nine sequential processes also requires two rotary feedthroughs. The simplicity of the dial turret transfer provides a system of reduced complexity that can be built at a reduced cost with fewer feedthrough devices than are usually needed in such systems, and an added benefit of enhanced reliability as a result of the reduced complexity. The minimal penetration of mechanical devices through the system walls also reduces the number of potential vacuum leak sites in the system.

Also, the circular design allows for mounting processing equipment either on an outer facing or an inner facing flange of any process station, so by design, a system can be arranged to process either or both faces of a workpiece. Also, the system can be arranged vertically with each station pumped from below with pumps and manifolding mounted below a lower baseplate, which allows maximum flexibility in selecting the processes to be used in the workstations. Pumps can be close coupled or remotely mounted as needed. Process gas entry through flow controllers and pressure and other monitoring equipment can be arranged to enter into the vertical passages through the upper baseplate, which is relatively thick for that purpose among others, and the arrangement is thus seen to be very flexible, suitable for performing nearly any needed vacuum process.

BRIEF DESCRIPTION OF THE DRAWINGS

FIG. 3B is a side view of FIG. 3A.

FIG. 4A is a cross-section showing a workpiece transfer in a single-workpiece air-lock.

FIG. 6A shows an automatic cassette-to-cassette loader for the system of the invention.

FIG. 8A shows an in-line air-lock cassette loader arrangement according to the invention.

FIG. 8C (a) and (b) show a section of FIG. 8B at different times during a loading sequence.

FIG. 8D is a section from FIG. 8B.

DETAILED DESCRIPTION OF THE PREFERRED EMBODIMENTS

Figure 1:
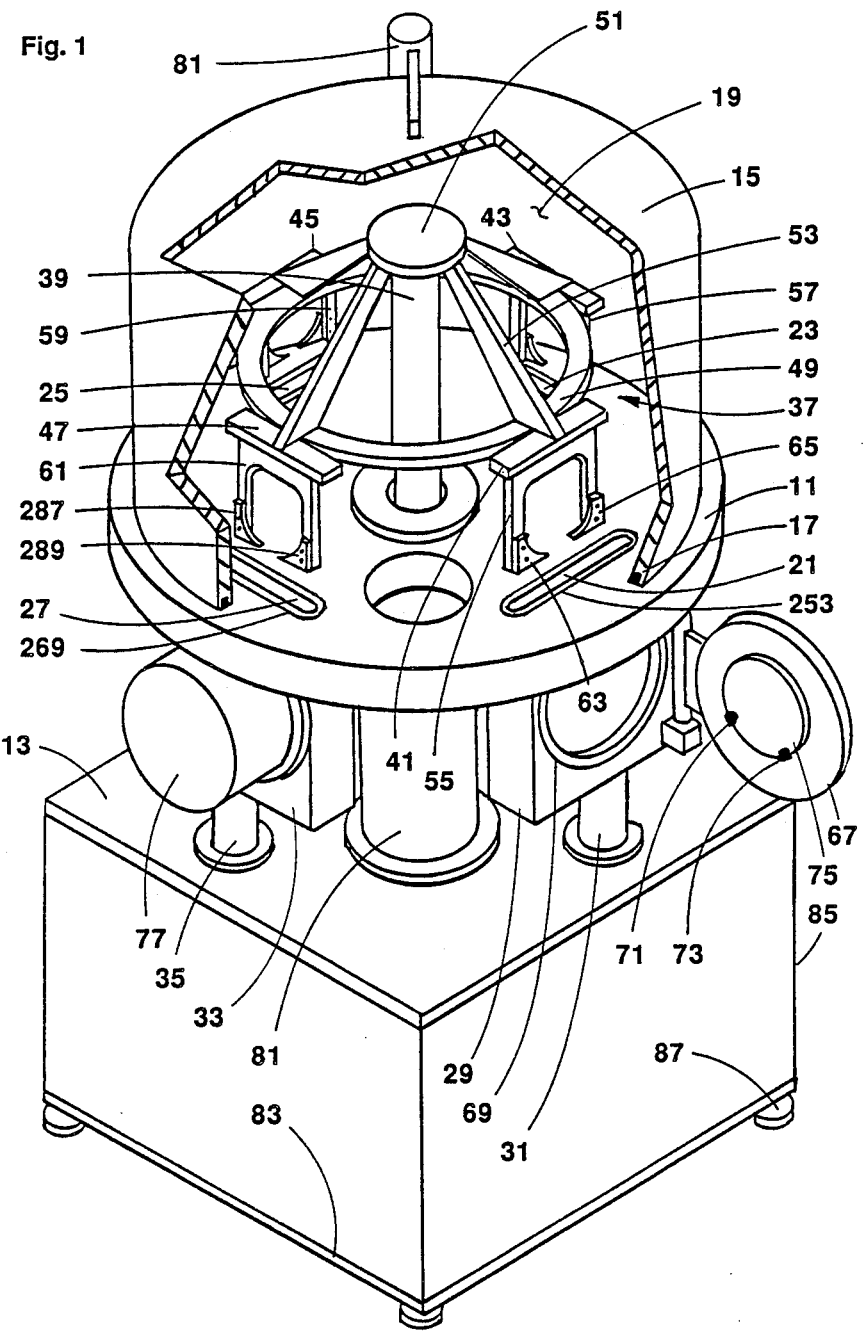
FIG. 1 is an isometric view of a system of the invention showing several essential elements and their placement.

FIG. 1 is an isometric drawing of a one-by-one vacuum processing system according to a preferred embodiment of the invention. An upper baseplate 11, circular in shape and typically about three inches in thickness is supported above a lower baseplate 13 which is substantially rectangular and typically about 2.5 cm in thickness. The vertical separation from the upper surface of lower baseplate 13 and the underside of upper baseplate 11 is about 51 cm. A vacuum tight dome 15 seals to the upper baseplate by means of a polymer seal 17 and forms a vacuum enclosure 19 under the dome. The diameter of dome 15 and of upper baseplate 11 in a preferred embodiment having four stations is approximately 91 cm. The height of the domed enclosure, which is known as the main tansport vacuum chamber, is about 61 cm.

There are four vertical openings 21, 23, 25 and 27 through upper baseplate 11. Each opening has a length about 25 cm. and about 2.5 cm. in width, with the length dimension of each being tangential to an arc concentric with upper baseplate 11. The openings are typically equally spaced around the baseplate, the spacing being 90 degrees for the four station system, and are spaced radially within about 2.5 cm. of the inner diameter of dome 15. Four stations have been chosen as adequate for illustration; however, there may be as few as two stations or many more than four.

Below opening 21 there is a depended vacuum chamber 29 with a top opening similar to 21 and sealed to the underside of upper baseplate 11 so that opening 21 communicates with the interior of depended chamber 29. In this preferred embodiment, this depended chamber measures about 41 cm. vertically, about 30 cm. in width parallel to the length of opening 21, and about 10 cm. in depth toward the center of the dial. Below the depended chamber there is a vacuum tight spool-piece 31 sealed to an opening in the bottom of chamber 29 and a similar opening through lower baseplate 13.

There is a similar depended chamber sealed below opening 23 and below opening 25 with similar spool-piece connections leading below lower baseplate 13, although these are not shown in FIG. 1; and a similar depended chamber 33 with a similar spool-piece 35 below opening 27.

A central feature of the invention is a dial turret assembly 37 which is fixed on a central vertical shaft 39. In this preferred embodiment, the central shaft may be raised and lowered by a distance of about 46 cm. by mechanism not shown in FIG. 1 below lower baseplate 13. That mechanism will be described later. Vertical shaft 39 may also be indexed rotationally in ninety degree increments when the shaft is in the uppermost position, and the indexing mechanism will also be subsequently shown. Dial turret assembly 37 raises, indexes and lowers along with central shaft 39.

Dial turret assembly 37 has four pads 41, 43, 45 and 47 around its periphery equally spaced at ninety degrees and at a radial distance such that at the completion of an index motion each of the pads will be directly above one of the four openings 21, 23, 25, or 27, and securely fastened to a ring member 49 of dial turret assembly 37, which ring member is held securely to a hub 51 by radial members such as member 53.

Below each pad 41, 43, 45 and 47 there is a carrier assembly for carrying a workpiece between stations. Carrier assembly 55 is positioned below pad 41, carrier assembly 57 below pad 43, carrier assembly 59 below pad 45 and carrier assembly 61 below pad 47. Each carrier assembly is in the form of an inverted u-shape and has two spaced apart and grooved supports for supporting a workpiece vertically. Supports 63 and 65 are shown as part of carrier assembly 55. As will subsequently be shown in more detail in other figures, the workpiece supports are spaced apart by a distance less than the diameter of a workpiece, the grooves in the supports are of a width a little greater than the thickness of a workpiece, and the supports together can thereby support a workpiece vertically with the aid of gravity. Each carrier assembly of the dial turret assembly has a pair of supports similar to supports 63 and 65.

When central shaft 39 travels to its lowermost position carrier assemblies 55, 57, 59 and 61 pass through openings 21, 23, 25 and 27 and appear in the depended chambers below the upper baseplate 11. At the lowermost position a seal is made between pads 41, 43, 45 and 47 and upper baseplate 11 so that each depended chamber is isolated from each other depended chamber and from main transport vacuum chamber 19.

In FIG. 1 depended chamber 29 is shown with a hinged door 67. Chamber 29 is used as an air-lock in this embodiment for introducing workpieces into main chamber 19 without substantially effecting the vacuum environment in chamber 19. There is a vent valve, not shown in FIG. 1, so that when dial turret assembly 37 is in the lowermost position and opening 21 is sealed, air-lock chamber 29 can be vented and door 67 opened. An O-ring seal 69 is shown on the front face of chamber 29, but would function as well on the inner face of door 67.

There are two grooved members 71 and 73 attached to the inner surface of door 67 and spaced apart a distance less than the diameter of a disk-shaped workpiece such as workpiece 75. These grooved members form a cradle for the workpiece, and with the door open a workpiece may be placed on the door, supported by the grooved members. This placement may be done manually, or in alternative embodiments by material handling mechanisms designed for that purpose.

Once a workpiece is placed on the door cradle, door 67 may be closed, against O-ring 69, which action may be manual, or may be performed by remotely controlled mechanism designed for that purpose. Grooved members 71 and 73 are spaced apart a distance less than the spacing between workpiece supports such as 63 and 65 on carrier assembly 55. Also, at the lowermost end of the vertical stroke, the position of workpiece supports 63 and 65 is about 2.5 cm. below the level of members 71 and 73. As a result, when door 67 is closed, workpiece 75 moves into a plane with the grooves of workpiece supports 63 and 65 within air-lock chamber 29, but about 2.5 cm. above and not in contact with them. The workpiece will be generally in the area between the vertical legs of carrier assembly 55.

With door 67 closed against O-ring 69 the vent valve can be closed and a pumping system (not shown) may be valved open to chamber 29 through spool-piece 31 to exhaust the air-lock chamber. When the air-lock chamber is exhausted to a suitable level, a vacuum in the $10^{-4}$ Torr range is typical, the mechanism to raise the turret is activated. As the turret rises the seals at openings 21, 23, 25 and 27 are broken and workpiece supports 63 and 65 engage workpiece 75 in the air-lock chamber as they pass the cradle formed by grooved members 71 and 73, and carry the workpiece into main transport chamber 19. At the uppermost point in the vertical stroke the four carrier assemblies are fully in chamber 19 and above the surface of upper baseplate 11. The indexing is activated as this uppermost point is reached and turret assembly 37 indexes ninety degrees, moving carrier assembly 55 with workpiece 75 to a point directly over opening 23. After indexing the vertical stroke mechanism is activated to lower the turret assembly, and carrier assembly 55 with workpiece 75 is lower through opening 23 into the depended chamber below. This is the first processing station. Process pedestals in the depended chambers have grooved members much like 71 and 73, so a workpiece lowered into a process chamber is transferred to a pedestal near the lowermost position of stroke, and recaptured when the turret rises again after processing. The raising, indexing and lowering of the turret, resulting in the transfer of a workpiece from one depended chamber to another, along with unsealing and re-sealing of openings through upper baseplate 11, requires typically about ten seconds. The dwell time at the lowermost position is adjustable to accommodate differing process requirements.

In four transfer sequences as described above a workpiece travels from the cradle formed by grooved members 71 and 73 on the air-lock door, through each of three depended process chambers in circular sequence, passing through main transport vacuum chamber 19 with each transfer, and is re-deposited on the cradle on the air-lock chamber door. On the traverse, three isolated processes may be performed on the workpiece in the four station embodiment. In operation a workpiece is unloaded during each cycle from the air-lock and a new workpiece is loaded, and the processes in the three depended process chambers operate in parallel on three different workpieces. The direction of travel in the description is counter-clockwise viewed from above, but could as well be clockwise.

Each depended chamber at a processing station has at least one flanged opening similar to the door opening to the outside of air-lock chamber 29, and the opening may be on the side facing away from dial center or on the side facing toward dial center. There can be openings to both sides, and either or both may be closed with blank flanges with seals. Processing equipment is mounted to such openings depending on processes to be performed. In FIG. 1 a round magnetron sputter coating source 77 is shown mounted to depended chamber 33 on the outward facing opening. Other kinds of processing equipment, such as electrically heated pedestals, electrically biased pedestals, radiant heaters and so forth may be mounted to the inner or outer facing sides of depended chambers, or both. Process gases may be introduced through openings in the depended chambers, closures mounted over openings in the depended chambers, or, preferably through channels machined in the relatively thick upper baseplate 11 and into vertical openings such as 23, 25 and 27. Pressure monitoring and other process monitoring equipment may be similarly mounted.

Pumping of process chambers is through a lower opening in the chamber and a spool-piece such as spool-piece 35 that connects process chamber 33 to lower baseplate 13. High vacuum valves and pumps may depend from the openings through lower baseplate 13 at the spool-pieces, or further vacuum manifolds may lead away from this point to pumps mounted at remote locations. As examples, a cryopump for pumping argon for a magnetron sputtering operation in a depended chamber would typically be mounted close-coupled right at the spool piece below the process chamber and above floorplate 79. A Roots type booster pump for pumping a reactive gas in a CVD type process would typically be mounted in a remote location, and a manifold would extend from the pump to the spool-pieces below the process chamber.

Vacuum dome 15 is attached to a motor driven elevator 81 so that, at times required for service, chamber volume 19 may be vented, and the dome may then be elevated above upper baseplate 11 and turret assembly 37 and pivoted to one side, exposing the mechanism under the dome and the inside surfaces of the dome and the upper baseplate for cleaning and other service. In operation the main transport vacuum chamber formed by vacuum dome 15 and upper baseplate 11 is pumped independently of the air-lock and processing chambers through a spool-piece 81 by a pump below lower baseplate 13 at the opening for the spool piece. The pump may be a cryo-pump, diffusion pump or other type, and includes a shut-off valve for isolation from the vacuum chamber.

Lower baseplate 13 is spaced above a floorplate 83 on support legs not shown, and these plates with side covers form a rectangular enclosure 85 where pumps and drive mechanisms are housed. The system is supported on leveling devices such as 87 beneath floor plate 83.

Figure 2:
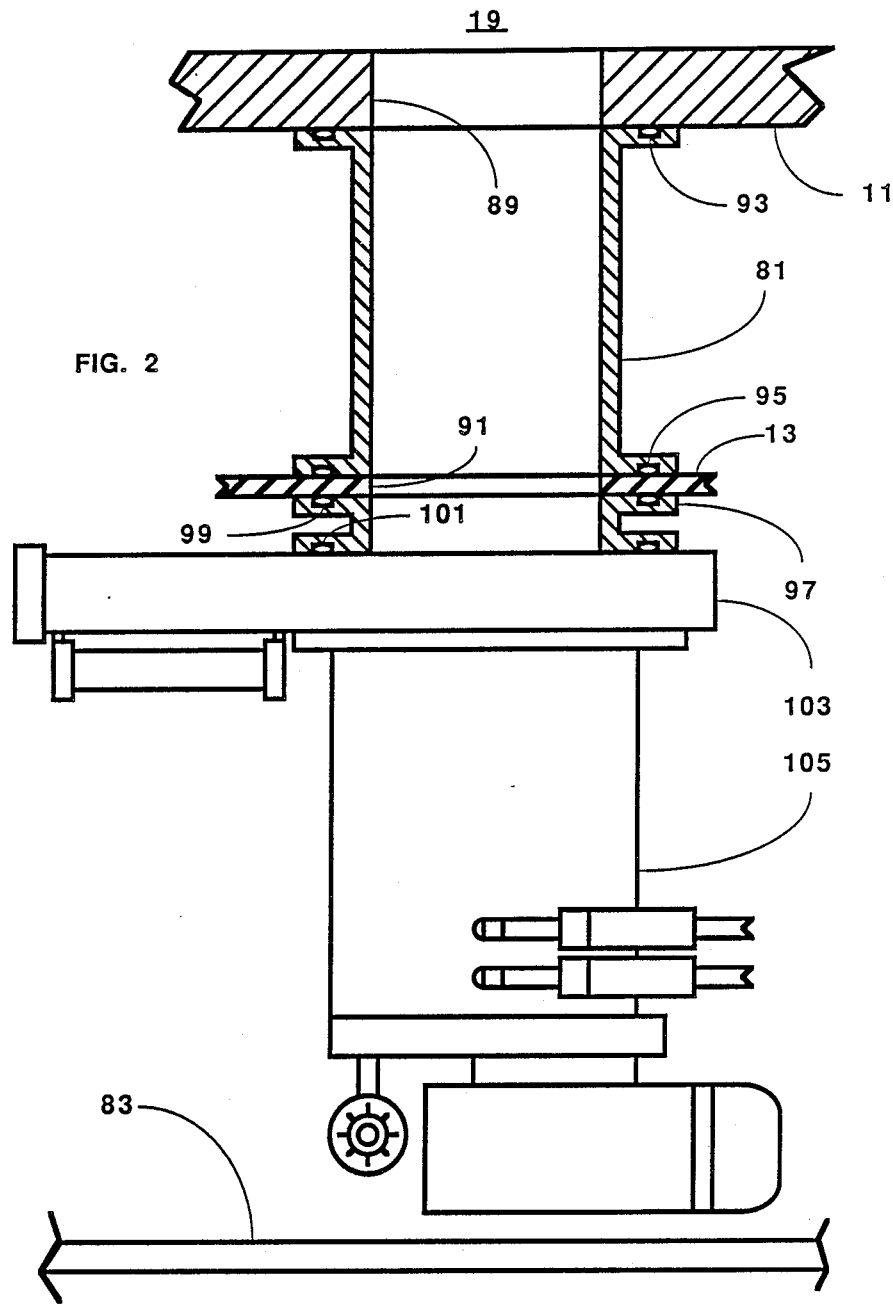
FIG. 2 is a cross-section from FIG. 1 showing a pumping system for a main pressure chamber of the invention.

FIG. 2 is a partial section taken through spool piece 81, upper baseplate 11 and lower baseplate 13 illustrating the independent pumping arrangement for main transport vacuum chamber 19. Upper baseplate 11 has an opening 89 and lower baseplate 13 has an opening 91, and these openings are aligned vertically with one another and also with the inside diameter of spool piece 81, which is sealed to the upper baseplate by O-ring 93 and to the lower baseplate by O-ring 95. Spool piece 81 serves both as a vacuum enclosure and as a structural support between the upper and lower baseplates.

A second spool 97 is sealed below baseplate 13 by O-ring 99 to facilitate mounting of a vacuum gate valve 103, sealed by O-ring 101. Fasteners through flanges of the elements are not shown. A cryo-pump 105 is mounted below gate valve 103, and when gate valve 103 is open, continuously exhausts main transport chamber 19. Base vacuum in the chamber is typically in the $10^{-7}$ Torr range and in the $10^{-6}$ Torr range during operation of the system. Another kind of high vacuum pump, such as a diffusion pump or a turbomolecular pump could be mounted in place of cryo-pump 105, or manifolding could be connected at opening 91 to lead to a remote location to connect to another kind of vacuum pump. This would be done, for example, if the pump chosen were too large to mount conveniently close-coupled at opening 91.

Figure 3A:
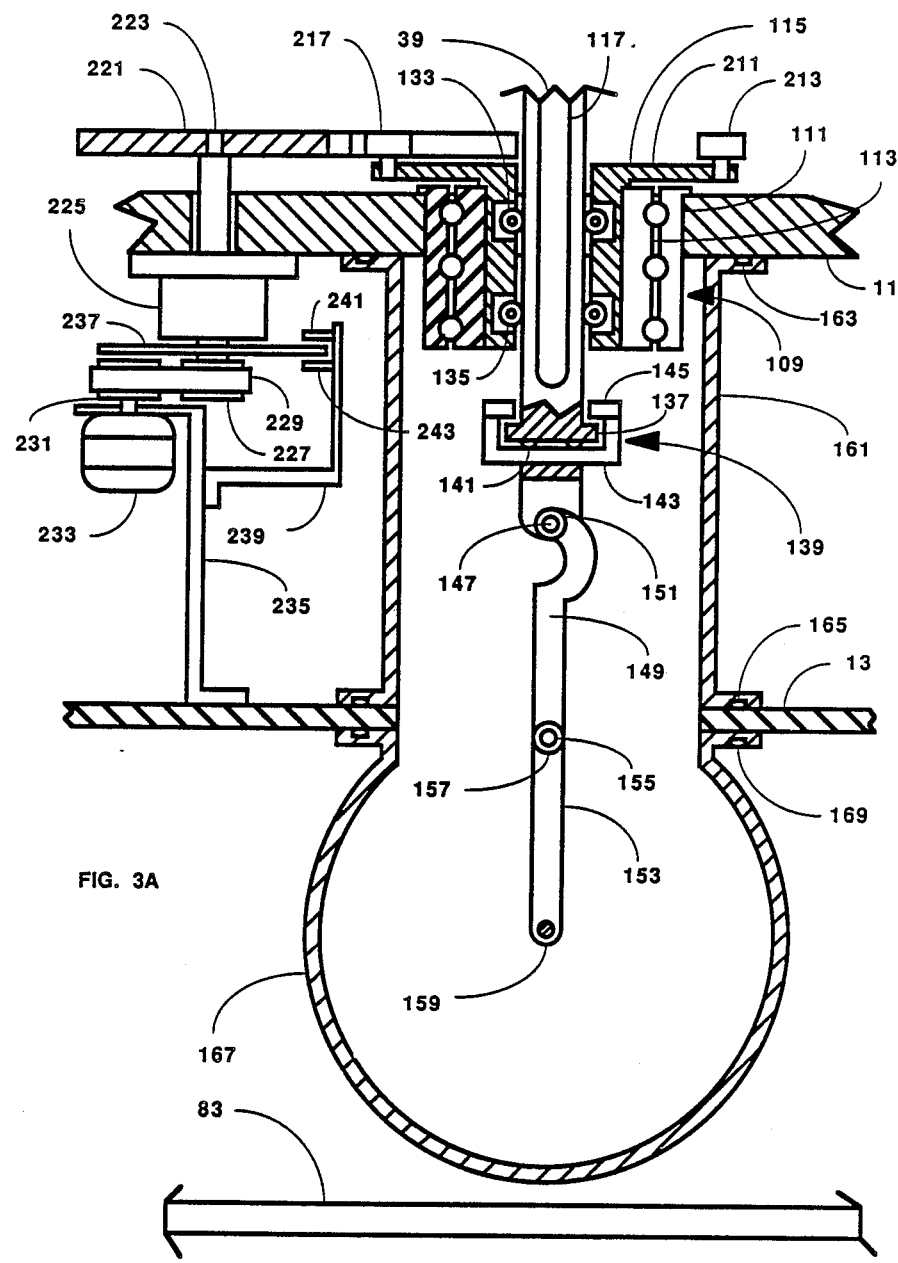
FIG. 3A is a cross-section showing a bell-crank drive and a Geneva drive for a turret assembly of the invention.
Figure 3C:
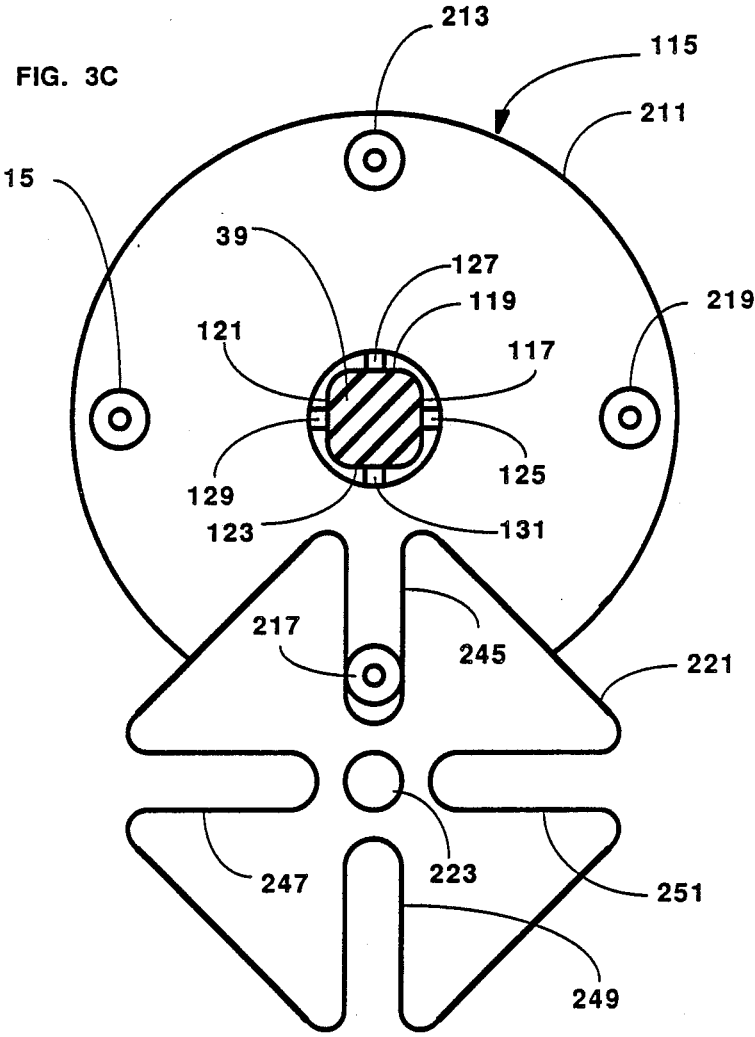
FIG. 3C is a top view of the Geneva drive of FIG. 3A.

FIG. 3A is an elevation view, mostly in section, face-on, of the reciprocating and indexing mechanism by which dial turret assembly 37 is caused to raise, lower, and index. FIG. 3B is a side-view to more fully illustrate the vertical drive mechanism, and FIG. 3C is a plan view from above upper baseplate 11 to more fully illustrate the indexing mechanism.

Upper baseplate 11 has a heavy rotary bearing arrangement 109 assembled in the central opening through which central shaft 39 passes. Outer race 111 of the bearing is stationary with the baseplate and inner race 113 is attached to a flanged rotary guide and indexing cylinder 115 such that guide and indexing cylinder 115 is constrained to rotate within the central opening through upper baseplate 11. Shaft 39, as seen in plan section in FIG. 3C, has four flats 117, 119, 121 and 123 machined vertically for a length somewhat longer than the length of vertical stroke required. Flat 117 is seen in FIG. 3A. There are two sets of four guide rollers each mounted at two separate levels vertically to the inside diameter of guide and indexing cylinder 115. Upper roller set 133 is composed of rollers 125, 127, 129 and 131, shown in plan in FIG. 3C. Lower roller set 135 is mounted below set 133 to provide vertical stability for shaft 39. The rollers are preferably a plastic material such as Teflon (a flourocarbon resin) and mounted on ball bearings not shown, and one roller of each set rolls on one flat of shaft 39. Shaft 39 is thus constrained to travel vertically only and cannot rotate relative to guide and indexing cylinder 115.

The lower end of shaft 39 has a flange 137 and a rotary coupling assembly 139 encloses the flange. The rotary coupling assembly has a thrust bearing 141, a housing 143, a cap flange 145 and a pivot stud 147. The thrust bearing coupling allows central shaft 139 to rotate in the horizontal plane without rotation of coupling assembly 139. Cap 145 extends inside flange 137 and provides for downward force to be applied at the bottom of the stroke to provide thrust for seals at openings for the depended chambers.

A connector link 149 is connected at one end on a bearing 151 to stud 147 pivotally, and at the other end to a bell crank arm 153 on another stud 155 with another bearing 157. Arm 153 is securely mounted to a drive shaft 159. In the position shown in FIG. 3A, with bell crank arm 153 in a vertical position above drive shaft 159, central shaft 39 is at its uppermost point of travel. At this position turret assembly 37 of FIG. 1 is also at the uppermost point of travel, and its workpiece carrier assemblies are above upper baseplate 11.

Rotation of bell crank arm 153 through an arc of 180° to a vertical position below drive shaft 159 moves central shaft 39 to its lower most position. The length of stroke vertically is twice the length of bell crank arm 153. In this preferred embodiment the vertical stroke used is about 46 cm. inches, so the length of arm 153 is about 23 cm. Connector link 149 is curved in shape so that it will not interfere with drive shaft 159 in the lowermost position. A spool-piece 161 extends from upper baseplate 11 to lower baseplate 13 and is sealed by O-rings 163 and 165. A vacuum 167 mounts and encloses the bell crank drive, and this leak-tight housing seals under lower baseplate 13 by O-ring 169.

FIG. 3B is a mostly sectioned side view of mechanisms of FIG. 3A. Bell crank housing 167 has an access cover plate 171 mounted by conventional fasteners with an O-ring 173. This plate allows access to the mechanism for assembly and service. A second such plate 175 is similarly mounted to an opposite opening in housing 167 with an O-ring 177. A vacuum rotary feedthrough device 179 with a special shaft is mounted through a central opening in plate 175. A typical feedthrough is based upon a rotary feedthrough made by Ferrofluidics Corporation. Shaft 159 which passes through feedthrough 179 is the bell crank drive shaft upon which bell crank arm 153 is mounted. A bearing assembly 183 is mounted inside plate 175 to provide support for shaft 159, and shaft 159 extends into a second such bearing assembly 185 mounted inside plate 171. These bearing assemblies are used to provide support for the considerable forces generated in operation so feedthrough 179 does not absorb such forces, which would be detrimental to the feedthrough mechanism. The extension of shaft 159 across the crank housing 167 for the support bearing assemblies is the principle reason link 149 is curved; so it does not strike shaft 159 in the lowermost position. It should also be apparent that the bell crank drive be a reversing drive. As illustrated in FIG. 3A, lowering motion for the turret is provided by clockwise rotation of bell crank arm 153 through an arc of 180 degrees from the uppermost position. Lifting motion requires counter-clockwise rotation because of the extension of shaft 159.

The end of drive shaft 159 opposite rotary feedthrough 179 has a pulley 187 engaged to a timing belt 189 which in turn engages a second pulley 191 mounted on an output shaft 193 of a gear reducer 195. The gear reducer is to provide a step-down in speed with a corresponding step-up in torque to operate the bell crank mechanism. The lifting and lowering operations are each adjusted to require about three seconds in the preferred embodiment. The input shaft of the gear reducer is connected by a coupling 197 to the output shaft of a motor 199. The motor and gear reducer are mounted to a common bracket 201 which supports them above floor plate 83.

The gear reducer is a conventional type such as made by Boston Gear Works and others. The drive motor in the preferred embodiment is a permanent magnet stepper motor.

A bracket 203 fastened to plate 175 carries a light source 205 and an optical sensor 207. A disk 209 mounted on shaft 159 outside feedthrough 179 has peripheral slots so that at the uppermost and lowermost travel positions of shaft 159 an electrical signal is generated by sensor 207 due to activation by light traversing one of the peripheral slots in disk 209. These electrical signals in conjunction with a digital control system are used to start and stop motor 199 at the proper times end in the proper directions to effect the desired action of the bell crank mechanism.

FIG. 3C is a top view from above upper baseplate 11 in the main transport vacuum chamber and shows a cross-section of central shaft 39 with flats 117, 119, 121 and 123. The rollers 125, 127, 129 and 131 of upper roller set 133 are shown engaged with the flats on the shaft. Guide and indexing cylinder 115 has an upper flanged portion 211, and four stud-type cam followers 213, 215, 217 and 219 are mounted to the flanged portion in an upward orientation, each about 20 cm. radially from center, and equally spaced at 90 degree intervals.

A four position Geneva wheel 221 is mounted on shaft 223 of a rotary feedthrough device 225 (shown in FIG. 3A) which is flange mounted below upper baseplate 11 to provide rotary motion across the vacuum boundary for indexing. Shaft 223 on the outside carries a pulley 227 which engages a timing belt 229 which in turn engages a pulley 231 on the output shaft of a drive motor 233. Motor 233 is preferably a permanent magnet stepper, but could be another type, such as a D.C. shunt-wound motor, and is mounted to a bracket 235 which supports the drive motor from lower baseplate 13. Shaft 223 outside rotary feedthrough 225 has a sensor disk 237 similar to disk 209 with peripheral slots. Disk 237 has four such slots at 90 degree intervals.

Bracket 239 carries a light source 239 and an optical sensor 241 which are used in conjunction with disk 237 and the digital control system to manage the indexing of the turret assembly. An algorithm for control, along with signals from sensors on the equipment, generates a signal to start motor 233 when the bell crank mechanism reaches its uppermost position, and an electrical signal generated by light through a slot in disk 237 intercepted by sensor 243 signals the digital control system to stop rotation of motor 233 after ninety degrees.

When motor 233 operates, shaft 223 rotates, and Geneva wheel 221 rotates with the shaft. In the preferred embodiment Geneva wheel 221 rotates clockwise seen from above, which causes turret assembly 37 to rotate counter-clockwise, also viewed from above. Geneva wheel 221 has four radial slots, 245, 247, 249 and 251, which are of a width to engage any of the cam followers 213, 215, 217 or 219 closely with little rotational backlash. In the position of FIG. 3C an index is completed and the mechanism is still. When rotation begins again, wheel 221 through slot 245 will force to follower 217 to cause cylinder 115 to rotate. As follower 217 leaves slot 245, follower 215 will be engaged by slot 247 to continue the rotation through 90 degress. At the end of the 90 degree index, slot 247 and follower 215 will be in the position shown initially for slot 245 and follower 217. There are many ways to design the Geneva mechanism which will be familiar to those skilled in the art of mechanical design, and FIG. 3C is meant to be representative rather than limiting. The Geneva preferably provides smooth acceleration and deceleration of the indexing motion, with maximum rotational velocity half way through the indexing and with positive locking in the stopped position.

The operation of the bell crank provides harmonic motion with smooth acceleration and deceleration so that the uppermost position and the lowermost position for the turret are both reached at inflection points in the harmonic, and there is no sudden stop to dislodge a workpiece from a carrier or a cradle. The Geneva is designed to provide the same kind of motion, with an inflection point at the stop point, for the same reason. The lift, index and lower sequence, moving a workpiece from one depended chamber to another is thus smooth and sure, with no sudden starts or stops.

Figure 4B:
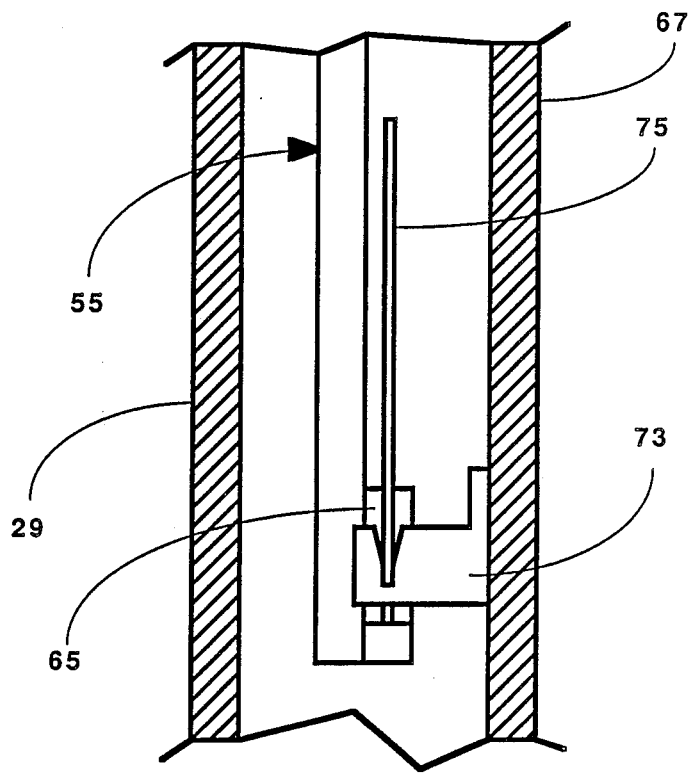
FIG. 4B is a side view of FIG. 4A.

FIG. 4A is a view inside air-lock chamber 29 looking radially outward from a position near the center of the dial. The view is a section taken along the length of opening 21 with turret 37 in the lowermost position and door 67 closed with workpiece 75. FIG. 4B is section A—A from FIG. 4A to show the relationships of the carriers and the workpiece in the air-lock chamber with door 67 closed.

When turret assembly 37 is in the lowermost position, pad 41 is against upper baseplate 11 and an O-ring 253 surrounding opening 21 is compressed, isolating chamber 29 from main chamber 19 above upper baseplate 11. This seal arrangement is common also to processing chambers, and there is here another advantage of the bell crank mechanism. As the turret lowers to the seal position, the bell crank arm nears its lowermost position, and in this position there is a considerable mechanical advantage in the conversion of torque on shaft 159 to downward force. This force is sufficient to compress all the O-ring seals without additional mechanism. With a four station system there will be four O-rings like O-ring 253, and with approximately 25 cm. long openings, the total length of O-ring material will be about 250 cm. A satisfactory vacuum seal for such an O-ring typically requires a compressive force of about 3.5 Kg. per linear cm.; so the total downward force required will be about 900 Kg. or about 1 ton in British units. If the O-rings are contacted by the pads on the turret when the bell crank arm is still 5 degrees from vertical, a force diagram will show that a torque of about 17 Kg.-meters (about 125 foot pounds) is needed with the bell crank arm of 23 cm., and this is quite manageable with the reducer arrangement illustrated. Because the bell crank continues to rotate at the O-rings compress, the torque requirement is actually less than this amount.

FIG. 4B shows that with the turret down, carrier assembly 55 in the air-lock chamber, and door 67 closed, a workpiece such as workpiece 75 supported on grooved members 71 and 73 on the door will be in planar alignment with grooves in workpiece supports 63 and 65 of carrier assembly 55. FIG. 4A shows that supports 63 and 65 will at this point be below the periphery of workpiece 75, so the workpiece continues to be supported by members 71 and 73.

Spool piece 31 is shown in section in FIG. 4A to have O-ring seals 255 at chamber 29 and 257 at lower baseplate 13. There is also a sliding O-ring seal 259 which allows spool 31 to be removed so chamber 29 can be removed, if desired in service or maintenance, without separating plates 11 and 13. This arrangement is common to all depended chambers.

A vent valve 261 and a vacuum shut off valve 263 are shown connected to a manifold 265 which is sealed under baseplate 13 by O-ring 267 for exhausting the air-lock chamber. Once door 67 is closed, valve 261 closes, valve 263 opens, and the chamber is evacuated. After evacuation, the bell crank mechanism is activated, and carrier assembly 55 starts upward along with all other parts of turret assembly 37. The motion is harmonic, having a sinusoidal pattern of velocity, so the initial motion is quite slow, reaching a maximum velocity one-half way up, then slowing again to stop at the uppermost position. With a vertical stroke of 18 inches and a total stroke time of 3 seconds, the maximum velocity will be about the tip velocity of the 23 cm. bell crank arm, which describes an arc of 180 degrees having a length of 71.8 cm. in 3 seconds, or 23.9 cm. per second.

At the point above the lowermost position that workpiece supports 63 and 65 contact workpiece 75, the upward velocity will be about 7.6 cm. per second, allowing a relatively gentle transfer of the workpiece to the carrier assembly.

Figure 5A:
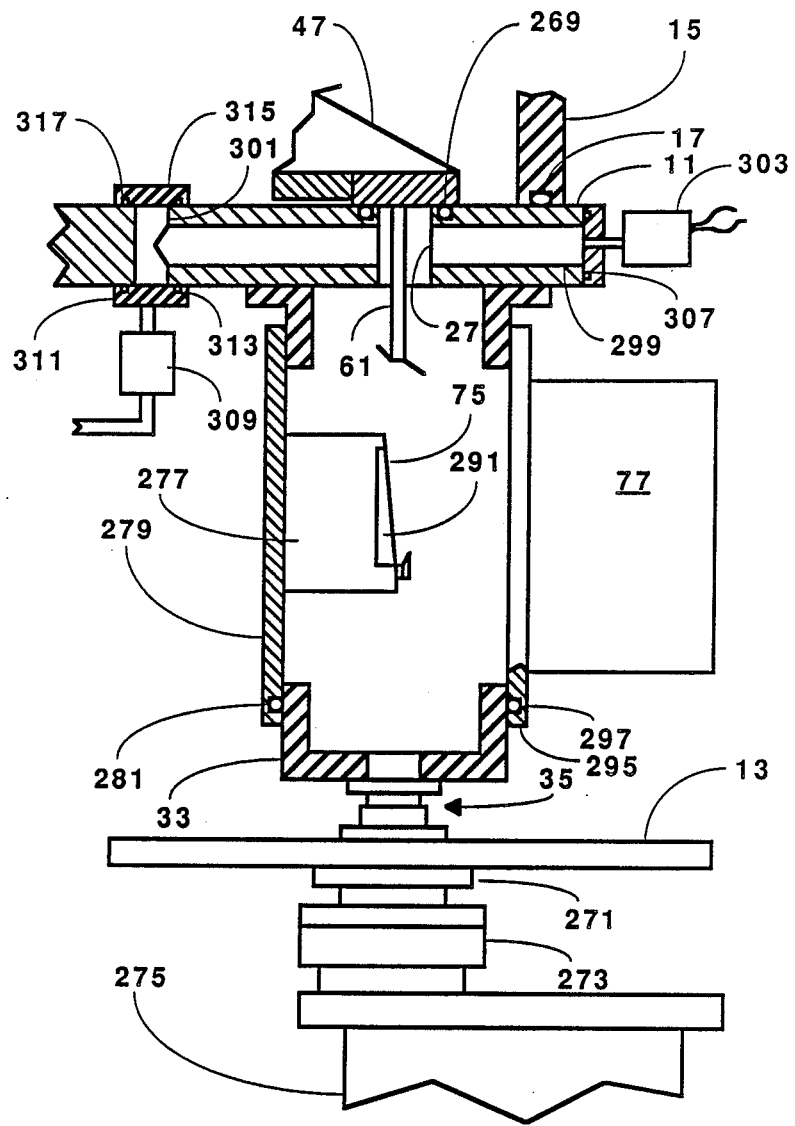
FIG. 5A is a side view cross-section of a process station of the invention.
Figure 5B:
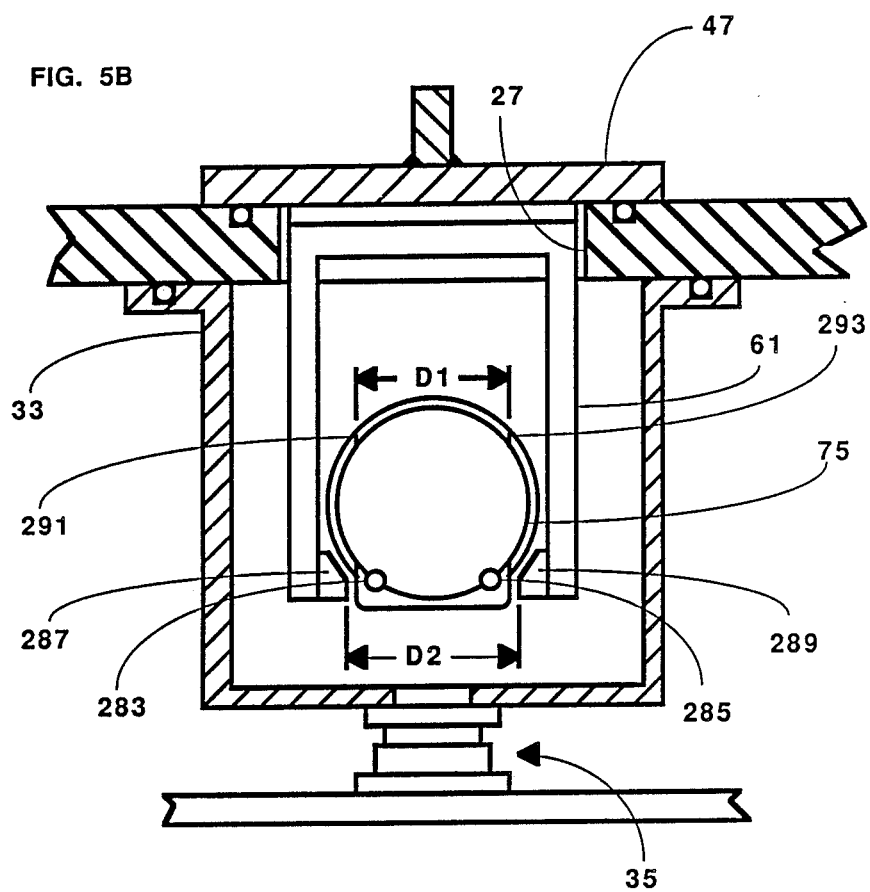
FIG. 5B is a face-on cross-section of the process station of FIG. 5A.

FIG. 5A is a section view taken through a typical depended process chamber, in this case chamber 33, which is the fourth chamber position from the air-lock, including the air-lock, and the third process position for the four station system. This is also the last process position before a workpiece returns to the air-lock for unloading. FIG. 5B is a section along the length of opening 27 through the chamber of FIG. 5A to show the relationship of a carrier assembly to a process pedestal during processing.

With the turret at the lowermost position, pad 47 contacts O-ring 269 isolating process chamber 33 the same way that the air-lock was shown to be isolated. This is the sealed position during processing. Spool 35, similar to spool 31 of FIG. 4A connects chamber 33 to baseplate 13, and through an opening in the baseplate and another spool 271 to a shut-off vacuum valve 273. A high vacuum pump 275 below the shut-off valve is a dedicated pump for pumping chamber 33 during processing. This pump can be one of several different kinds, depending on the process dedicated at the station, or manifolding may be attached to lead to a remote pump. In FIG. 5A, with the process being magnetron sputtering, pump 275 would preferably be a cryopump.

A process pedestal 277 is mounted to a rear plate 279 which is in turn mounted to chamber 33 and sealed by O-ring 281. Process pedestal 277 is slightly larger in diameter than workpiece 75, and the front face of the pedestal is inclined at an angle of about 5 degrees with the top of the pedestal toward the center of the dial. As shown in FIG. 5B, there are two supports 283 and 285 on the front of the pedestal, spaced apart a distance less than the spacing of supports 287 and 289 of carrier assembly 61. Carrier assembly 61 with grooved supports 287 and 289 clears supports 283 and 285 as the turret assembly travels up and down. There are, in addition, two machined flats, 291 and 293, one at each side of pedestal 277, providing clearance for supports 287 and 289 in passing.

Supports 283 and 285 are grooved and positioned such that as a vertically held workpiece makes contact when supports 287 and 289 pass downward, the workpiece is urged to recline in the direction with the top toward the center of the dial. The workpiece thus lies flat on the reclining surface of pedestal 277 while in the process chamber, as illustrated in FIG. 5A. After processing, carrier assembly 61 rises, grooved supports 287 and 289 contact the workpiece, and the grooves are such that the workpiece is returned to vertical as it is captured, and leaves the chamber with carrier assembly 61.

FIG. 5A shows the magnetron sputter coating source 77 attached by a flange 295 and sealed by O-ring 297. The source is powered by a high voltage line, has electrical connections for internal electromagnets, control connections for flow sensors and safety interlocks, and connections for cooling water inlet and outlet, but these elements are not shown. In this preferred embodiment, the sputter coating source is a plasma device for depositing materials from a target in the source to the surface of the workpiece. In such a system, the target is maintained at a high negative potential, and the plasma is created by that potential and a working gas, usually argon, fed into the chamber and maintained at a low pressure, typically in the range of $10^{-3}$ Torr. For sputtering operations dedicated pump 275 is open to the chamber, and argon is continuously fed in at a rate that establishes the desired pressure by equilibrium against the ability of pump 275 to pump the argon.

There is a radial hole 299 machined from the outside diameter of upper baseplate 11 through opening 27 and beyond connecting with a vertical hole 301 machined vertically through the dial. These holes are to facilitate mounting of monitoring instruments, the introduction of working gases, and special pumping arrangements. There are radial and vertical holes like 299 and 301 at each of the stations on the dial. In the sputtering arrangement of FIG. 5A, a capacitance manometer pressure sensing transducer 303 is shown mounted to a plate 305 on a seal 307 at the outer end of radial hole 299. This instrument is used to monitor the argon pressure during processing and to provide an input for a closed loop control algorithm with the digital control system to manage a flow controller 309 that is mounted on a plate 311 with O-ring 313 at the lower end of vertical hole 301 through the upper baseplate. The upper end of hole 301 is sealed from the inside of the main transport vacuum chamber by a plate 315 and an O-ring 317. Argon is supplied through flow controller 309 into hole 301, hence to hole 299, into passage 27 and on into the interior of the process chamber. The argon flows through the chamber and is pumped away out the bottom by dedicated pump 275 through spool 35 and valve 273.

The holes in upper baseplate 11 at the process stations provide a very flexible arrangement for process device mounting. One option is that for processes not requiring dedicated pumping, plate 315 can be removed and the lower opening of the chamber may be sealed, removing spool 35, spool 271, valve 273, and pump 275, saving considerable hardware expense. Pumping of the process station is then accomplished by the pump dedicated to the main transport vacuum chamber through holes 301, 299 and passage 27, even though the upper end of passage 27 is sealed during processing. Another alternative is to place a small pump at the lower end of hole 301, with a valve blanking the upper end, to pump the process chamber. This arrangement also eliminates pump 275 and associated equipment. Manifolding leading to pumps at remote locations can also be mounted at hole 301. Another use of the outer end of radial hole 299 is the mounting of a residual gas analysis head to monitor constituents and contaminants of the environment in the process chamber both during and between processing cycles.

There are a number of options for process pedestal 277. One is a heat source. A resistance element can be mounted in the pedestal to heat the face where the workpiece is in contact with watercooling applied so that heat is not transferred into plate 279. Heating can be done prior to processing, during processing, or after processing. By mounting the pedestal on an insulator to plate 279, the pedestal can be electrically biased to perform a broad range of bias operations, including biased sputtering, etch cleaning, etching, and biased CVD processes. A broad range of process devices can be mounted to the front face in place of the sputter source shown, such as CVD gas distribution manifolds, flash anneal heat sources, and biased or grounded electrodes for various purposes.

As an alternative to the process pedestal shown, other pedestals can be installed fastening to the sides and the bottom of the process chamber which allow both surfaces of a substrate to be processed simultaneously. Alternatively, a process pedestal of the kind shown in FIG. 5A can be mounted to the inner face in one process station and the other face in another, with other process equipment, such as a sputter source, also switching sides, so a workpiece can be processed on one side in one station and the other side in another.

It will be readily apparent to those skilled in the art of vacuum system design and manufacturing that the dial arrangement lends itself to many and varied processing schemes, and many changes can be made without departing from the spirit and scope of the invention. A larger dial may be used to provide additional space for processing equipment on the inner faces of process chambers, and with a larger dial, additional stations may be employed. Processing stations can be oriented in other than the tangential arrangement of the preferred embodiment, among other changes. Also as an alternative embodiment, the dial can be used with a turret with the capability to place a workpiece in the depended chamber and retract from the chamber, using a slit valve to seal the opening through upper baseplate 11 rather than relying on the pressure of the turret assembly. This embodiment is particularly useful in situations where the presence of the carrier assembly in the process chamber is considered damaging to the process. Carryover of contaminants from one chamber to another is minimized. Also, in this alternative embodiment, the mechanism for vertical travel no longer has to provide the considerable pressure for sealing.

A similar alternative embodiment is to use a single arm mounted from the center shaft for picking and placing workpieces one-at-a-time to and from process chambers, also incorporating slit valves. This alternative can be programmed to move workpieces in involved sequences, using particular stations more than once during a sequence, and varying the dwell times in the various processes.

Also, although in the embodiments already described, workpieces may be loaded to the door cradle and unloaded manually, there are also ways known in the art to automatically load workpieces to and from a cassette or other carrier to the cradle and back into a cassette.

Figure 6B:
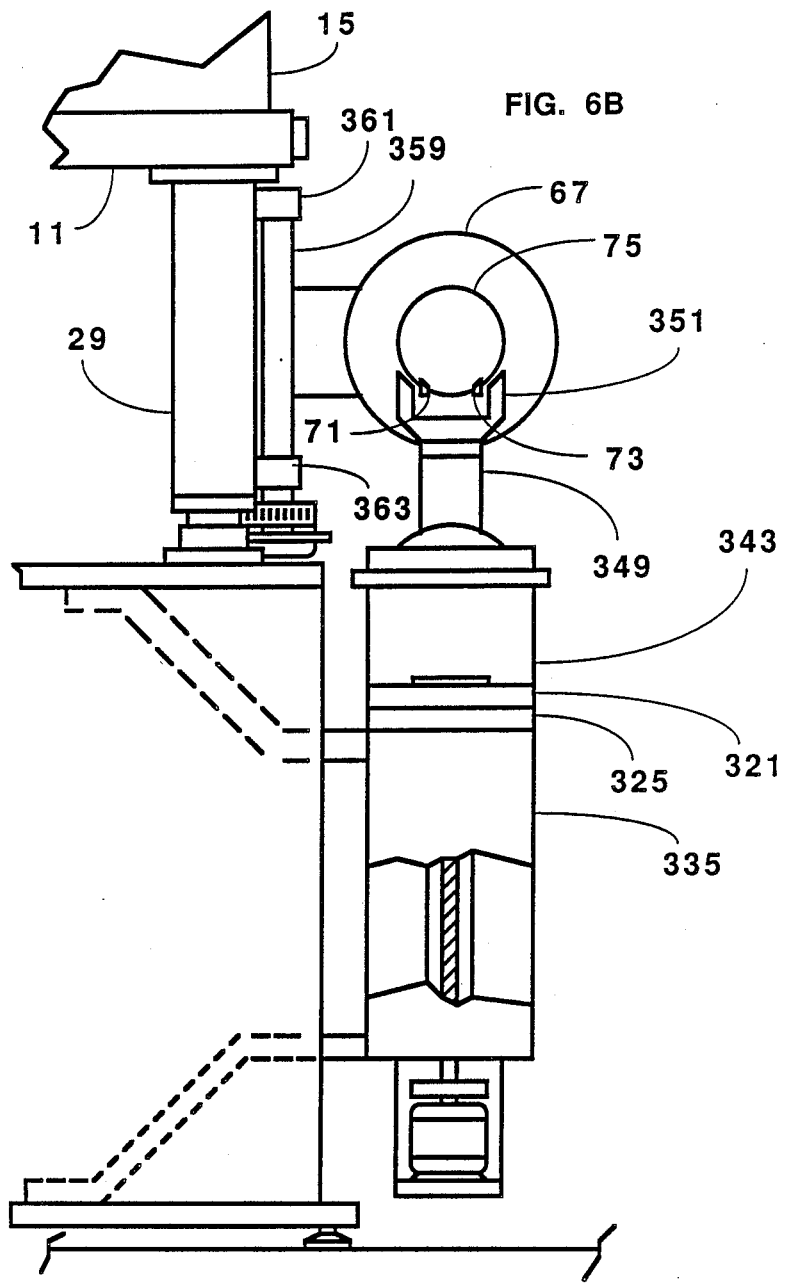
FIG. 6B is a side view of FIG. 6A.
Figure 6C:
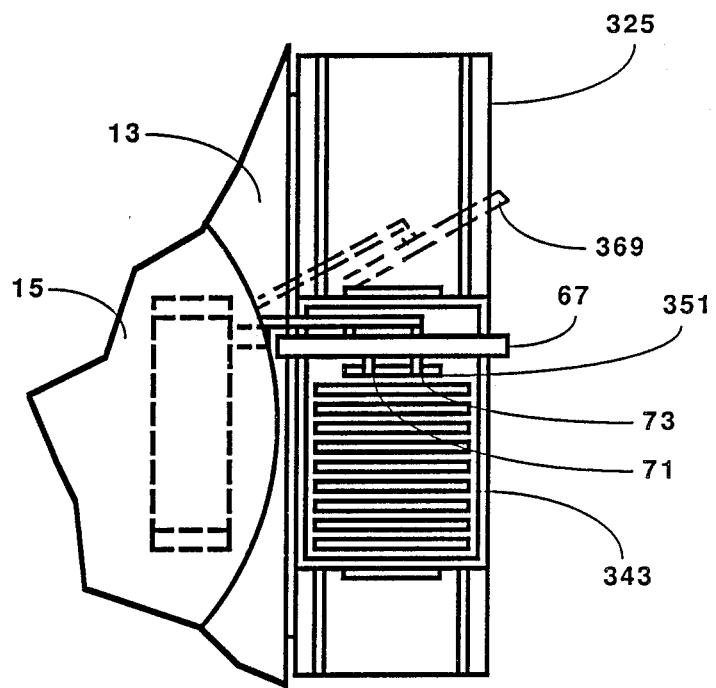
FIG. 6C is a plan view of FIG. 6A.

FIG. 6A is an elevation view facing toward dial center of an arrangement for loading and unloading the dial air-lock to and from a cassette of disk-shaped workpieces. FIG. 6B is an elevation end view in the direction of arrow B of FIG. 6A. FIG. 6C is a plan view in the direction of arrow C of FIG. 6A.

FIG. 6A shows a cassette loading assembly 319. A mounted platen 321 is constrained to move only in the direction of arrow 323 by slides in top frame member 325. Platen 321 has an extension 327 below frame member 325, and the extension carries a worm screw nut 329. Worm screw 331, supported in bearing 333 attached to end frame member 335, and driven rotationally by motor 337 and timing belt 339 through bearing mount 341 in end frame member 343, passes through and engages nut 329. A cassette 343 of disk-shaped workpieces is placed on platen 321 between stops 345 and 347. Optical sources and receivers not shown are used to generate electrical signals relative to the position of the cassette using disk support slots of the cassette to interrupt the light beams, and these signals provide input to the digital control system in conjunction with an input logic algorithm generate signals to control motor 337 so that cassette 343 may be positioned with workpieces and empty slots aligned with a vertically acting load slide 349.

Load slide 349 has a grooved and forked upper end 351, best seen in FIG. 6B, in an elevated position, and is shown in FIG. 6A in a lowered position. Grooved end 351 may engage and support a workpiece in vertical orientation. Load slide 349 travels vertically constrained by guides in frame member 353 and is moved to a full up position and a full down position by a worm screw 355 driven by a motor 357 similarly to the arrangement for moving platen 321. Load slide 349 does not stop between end positions, and the end positions are sensed by electrical switches not shown.

Door 67 of air-lock chamber 29 is mounted on a rotateable shaft 359, which is mounted at an upper end in a bearing block 361 and through a bearing in a lower bearing block 363. The vertical door shaft is driven by a motor 365 through a timing belt drive train and there is an optical assembly 367 including a slotted disk for sensing three door positions. In the preferred embodiment, one position is door closed on chamber 29, another is open ninety degrees, as shown in FIGS. 6A, 6B and 6C, and the third is an additional approximately twenty degrees, 110 degrees total, shown by phantom outline 369 in plan view FIG. 6C.

In operation when a cassette of unprocessed workpieces is placed on platen 321 and the digital control system is signaled that production may begin, motor 337 operates to move cassette 343 so that a first workpiece is aligned with load slide 349. Chamber 29 is vented and motor 365 operates to move door 67 to position 369, beyond the 90 degree position aligned with load slide 349. Slide 349 is then moved by motor 357 to a full up position, and as the slide passes through a slot in the bottom of cassette 343, a workpiece is engaged by upper end 351 and is lifted and supported vertically, stopping at a position where the lower edge of the workpiece is above the level of grooved members 71 and 73 on door 67. Door 67 is then moved by motor 365 to the 90 degree position, extending grooved members 71 and 73 beneath the workpiece on load slide 349. Slide 349 then retracts to the lower position, and the workpiece is transferred to the cradle on door 67 formed by members 71 and 73. Door 67 is closed, the air-lock is exhausted, and the dial transfer operates while a new workpiece is aligned with load slide 349. When door 67 is opened again, a new workpiece is loaded, following the same steps.

After a fourth workpiece is loaded, when door 67 is opened, there is a workpiece on the cradle, the workpiece first loaded, having been through all three processes and deposited on the cradle by the carrier of the turret assembly entering the air-lock from the third process chamber. The finished workpiece has to be unloaded before a fifth workpiece can be loaded. To that end platen 321 is moved to align the first slot in cassette 343 with the load slide, the chamber door is opened to the 90 degree position, the load slide is brought to the up position, engaging and lifting the finished workpiece above the door cradle. The door then is moved to the 110 degree position so the door cradle is no longer below the workpiece, and slide 349 is retracted with the finished workpiece. As the slide passes through the cassette, the workpiece is transferred to the cassette in the slot it started from, and the load slide is brought to the lower position where it will not impede cassette movement. Then platen 321 is moved to the next workpiece to be loaded. From that point until the final workpiece is loaded, both loading and unloading is continued until the last unprocessed workpiece in the cassette is loaded to the air-lock chamber. At that point there will be four more cycles until the last processed workpiece is placed back into the cassette. At that point the logic algorithm, having counted the workpieces, may trigger a signal for an operator to retrieve the cassette of finished workpieces and provide a new cassette of workpieces to be processed.

In the operation with a single workpiece air-lock, whether manually or automatically loaded, the air-lock pumping is limited to a fraction of the cycle time. For some manufacturing sequences with some products that may not provide adequate outgassing and the time required to keep a workpiece under vacuum before a first process is performed may become the limiting factor in cycle rate rather than the longest of the parallel processing times. In another embodiment the air-lock cycle can be separated from the processing cycle, so a longer time may be provided for outgassing before processing.

Figure 7A:
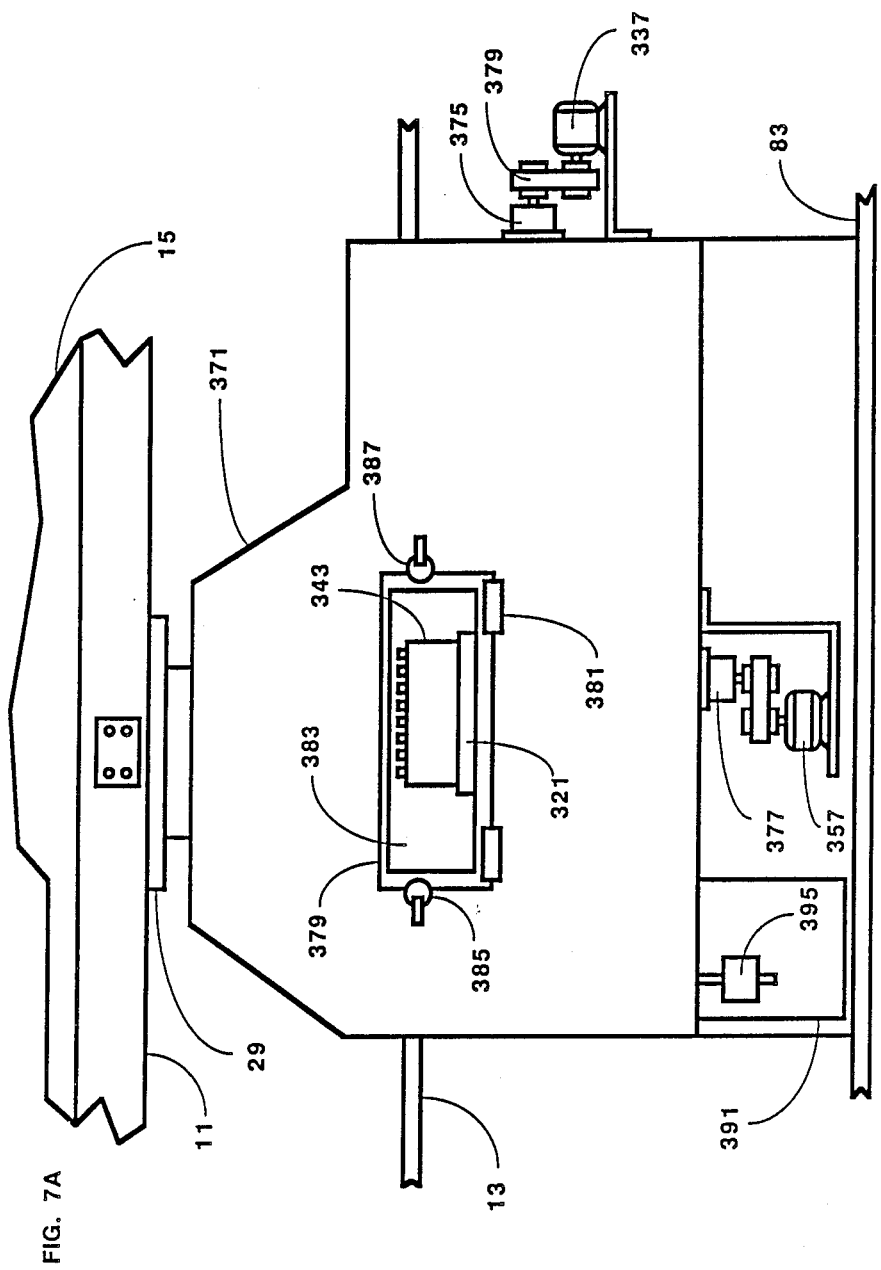
FIG. 7A shows a single chamber cassette air-lock according to the invention.

Shown in FIG. 7A is a front elevation view of a cassette loading arrangement, similar to FIG. 6A, except most of the elements of the loader of FIG. 6A have been enclosed in a vacuum chamber 371.

Figure 7B:
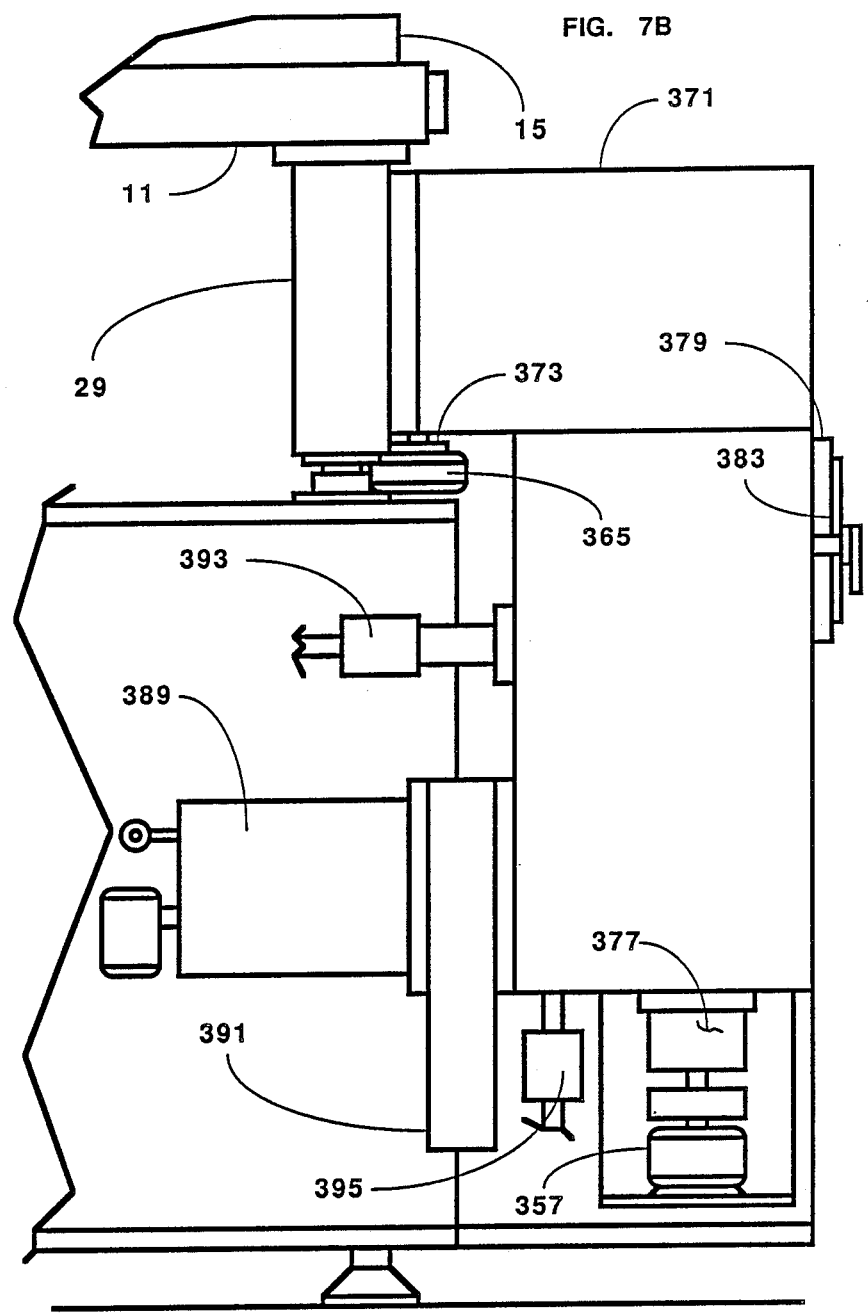
FIG. 7B is a side view of FIG. 7A.

The door of chamber 29 operates just as it did in FIG. 6A, but it is now located within vacuum chamber enclosure 371. Drive motor 365 and associated sensors which operate door shaft 359 are outside the vacuum chamber, and as illustrated in FIG. 7B, a vacuum rotary feedthrough 373 is provided to transmit the rotary motor torque across the boundary of chamber 371. Platen 321 is driven as before by a worm screw 331, but within the vacuum enclosure, and a vacuum rotary feedthrough 375 is provided. Motor 37 and associated equipment are mounted outside the vacuum enclosure. Load slide 349 in the chamber is driven by worm screw 355 (shown in FIG. 6A) and vacuum rotary feedthrough 377 is provided with drive motor 357 outside the vacuum enclosure.

There is a sealed door 379 into chamber 371 at the position for placing and retrieving cassettes to and from platen 321, and the door may have a window 383 so operations within the enclosure may be monitored from outside. Door 379 is mounted on a hinge 381 and has two rotary, compressive latches 385 and 387.

Shown in FIG. 7B is a side elevation view of chamber 371 which is mounted to chamber 29. A high vacuum pump 389 and a high vacuum valve 391 are used for pumping chamber 371 during operation. There is also a roughing valve 393 leading to a remote rough vacuum pump, and a vent valve 395.

In operation, with the turret assembly in the down position sealing chamber 29 and with door 67 closed, vent valve 395 is opened, venting chamber 371. Latches 385 and 387 are rotated releasing door 379 which is then opened. A cassette of processed workpieces is removed and a cassette of unprocessed workpieces is placed on platen 321 in chamber 371. The door is closed and latched, vent valve 395 is closed, roughing valve 393 is opened and chamber 371 is rough pumped. At a preplanned cross-over pressure, roughing valve 393 is closed and high vacuum valve 391 is opened, so chamber 371 is pumped by high vacuum pump 389. At a preplanned pressure or time, cycling is signalled to begin, and is continued as previously illustrated with the aid of FIGS. 6A, B, and C, until all workpieces are processed. Then valve 391 may close, vent valve 395 open, and the cycle can be repeated. Roughing valve 263 and vent valve 261 of FIG. 4A are no longer needed, as chamber 29 is no longer an air-lock. In some applications, rough pumping through valve 393 will be adequate and high vacuum pump 389 and valve 391 will not be needed.

In this embodiment the air-lock pumping is continued for the full time it takes to process all the workpieces in a cassette, so the pumping and outgassing time which is a mulitple of the longest processing time; can be as much as the longest processing time times the number of workpieces in a cassette.

In the embodiment described above using a chamber for a cassette load of workpieces, transferring the workpieces to and from chamber 29 under vacuum, the interruption of processing to replace a cassette is longer than for the embodiment automatically loading and unloading in air to chamber 29 as a single workpiece air-lock. Time must be allowed for venting chamber 371 and pumping it down again after a new cassette is loaded through door 379. There is a further addition that may be made to eliminate this time, allowing continuous production to be performed.

FIG. 8A shows an arrangement in which cassette loading and unloading is performed in a vacuum chamber as in chamber 371 of FIG. 7A. Chamber 397 is much like chamber 371. There is an indexing platen 399 inside chamber 397 which operates in the same way and for the same purpose as platen 321 of FIG. 7A. Platen 399 is for indexing cassettes from slot to slot while a load slide loads and unloads to a door within the chamber exactly as was done in the single chamber cassete airlock described earlier, except platen 399 is longer than platen 321 and has two cassette positions for holding two cassettes at the same time. Platen 399 is driven by a worm screw (not shown) through an end wall of the chamber, and rotary feedthrough 375 with belt drive 339 and motor 337 are shown in the same relative position that they were used on chamber 371. The load slide external drive components, including motor 357 and rotary feedthrough 377, are also shown. There is no longer a load door in the front of the cassette vacuum chamber. There may be a window arrangement such as frame 401 with separate panes 403 and 405 shown. Separate panes are used to limit the forces on each resulting from the pressure differential when chamber 397 is exhausted. The panes are preferably heavy plate glass, and are mounted on O-ring seals (not shown).

There are two flanged openings 407 and 409 into chamber 97, one through each end wall and of a sufficient size and location that cassettes can pass through each opening. Vacuum gate valves 411 and 413 are mounted to these flanged openings with O-ring seals by screw fasteners (not shown), and these openings through each of the valves is large enough to pass a cassette and mechanism to transport a cassette that will be illustrated. The two gate valves may be purchased valves, such as are available from High Vacuum Apparatus Manufacturing, Inc. and other suppliers, or may be made specifically for the chamber by principles well known to those skilled in the art of vacuum valve design.

A separate air-lock chamber of a size to conveniently hold a single cassette is mounted to each gate valve 411 and 413 on the side opposite the mounting to chamber 397. These are chambers 415 and 417. Chamber 415 is an entrace air-lock chamber for moving cassettes of unprocessed workpieces into chamber 397, and chamber 417 is an exit air-lock chamber for moving cassettes out of chamber 397. Entrance air lock 415 has a door 419 sealing on an O-ring (not shown), and is moveable pivotally about a hinge 421. There is a rotary, compression manual latch 423 for latching the door in the closed position and pre-compressing the O-ring seal. There is also a sealed manifold connection 425 to a vacuum roughing valve 427 which connects by suitable vacuum manifolding to a roughing vacuum pump not shown. Exit air-lock chamber 417 has a door 429 on a hinge and a latch 433 corresponding to the similar components of entrance air-lock 415. There is also a manifold connection 435 to a roughing valve 437 which in turn leads to the same roughing vacuum pump as used for the entrance air-lock. Alternatively, manifold 435 may lead to and join manifold 425, eliminating roughing valve 437 and requiring that both air-locks be exhausted together through the single roughing valve 427. Each air-lock has a vent-valve as well, valve 439 for entrance lock 415 and valve 441 for exit lock 417.

Figure 8B:
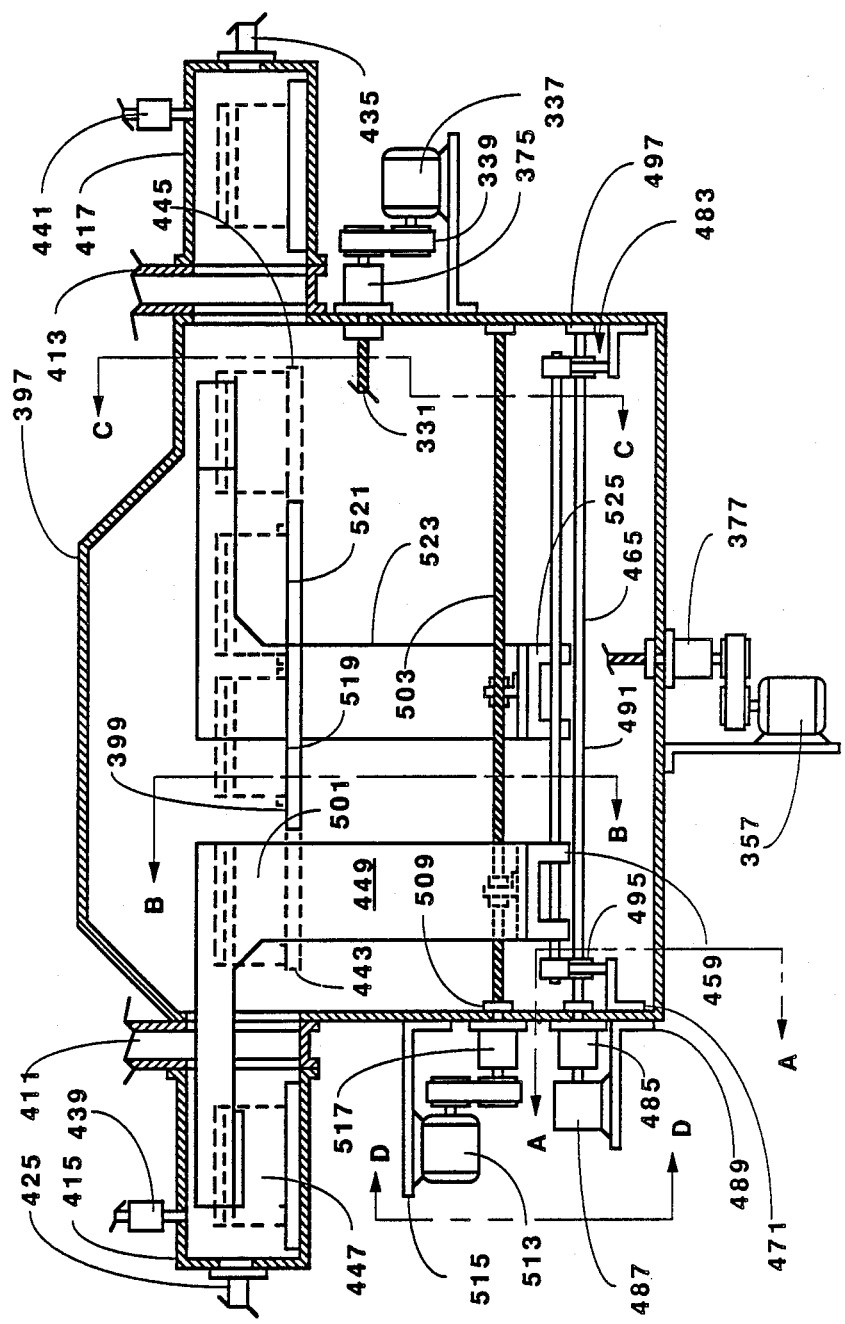
FIG. 8B is a cross-section of FIG. 8A.

FIG. 8B is a partial section of FIG. 8A, seen in the same elevation as 8A, showing the boundaries of chambers 397, 415 and 417. Platen 399 is shown within the boundaries of chamber 397 and the worm screw drive including motor 337, belt 339 and feedthrough 375 for driving worm screw 331 which indexes platen 399 is also shown, but the connection to platen 399 and the guide frame for platen 399 are not shown to avoid confusion in introducing new elements. The vertically driven load slide 349 is also not shown for the same reasons, but drive motor 357 for the load slide is shown with feedthrough 377. The platen, load slide, and door operate just as they did in the embodiments described with reference to FIGS. 6A and 7A.

Moving cassettes into chamber 397 from air-lock chamber 415 and out again through air-lock chamber 417 requires additional mechanism to accomplish internal transfers when the chambers are under vacuum. Platen 399 is capable of movement toward chamber 415 as far as point 443 and toward chamber 417 as far as point 445. A cassette loaded at the entrance air-lock at point 447 needs to be moved through valve 411 and into chamber 397 after chamber 415 is evacuated and valve 411 opens. A cantilevered load arm 449 is provided for this purpose. FIG. 8C is view B—B from FIG. 8B and shows the nature of load arm 449 and how a cassette is engaged.

A cassette 451 is used that has a rim 453 which may be used for supporting the cassette. Commercially available cassettes, such as those made by Flouroware Corporation and others have such a rim. Alternatively, cassettes may be provided which are designed specifically for certain substrates to be processed and which are operable in the system of the invention. Load arm 449 has a pick-up end forming two ledges 455 and 457 that are used to engage rim 453 of cassette 451. Load arm 449 is mounted by conventional fasteners on a bearing block 459. The bearing block has four linear bearings, two of which 461 and 463 may be seen in FIG. 8C. The bearings ride on two shafts 465 and 467, one of which, 465, is seen in FIG. 8B, and the shafts extend nearly the inside length of chamber 397.

Surface 469 of FIG. 8C represents both the base surface in chamber 415 where a cassette is placed, and the upper surface of platen 399 which supports cassettes during load and unload to the door of chamber 29. The two surfaces are at the same height, and cassettes are moved from one to the other. For this to be done, the cassette has to be lifted above the level of surface 469. This lift is accomplished by lifting the two shafts 465 and 467. In part (a) of FIG. 8C load arm 449 is shown in a lower position not engaging cassette rim 453. In part (b) shafts 465 and 467 are shown elevated, and cassette 451, having been lifted, is suspended above surface 469. The vertical distance D2 required need only be enough to clear the surfaces and any stops used for positioning a cassette. D2 is typically about 0.95 cm.

The mechanism for lifting shafts 465 and 467 to accomplish lifting of a cassette is illustrated by FIG. 8D, which is view A—A of FIG. 8B. A bracket 471 is fastened to the inside of the end wall of chamber 397 by conventional fasteners 473 and 475. Two vertical shafts 477 and 479 are fixed in holes in brackets 471. A shaft support block 481 has two holes matching the diameter and spacing of shafts 477 and 479, and is slidably engaged on the two vertical shafts. Support shafts 465 and 467 that carry the load arm assembly are fixed at one end into block 481. A similar but opposite hand assembly 483 to the assembly described of elements 471, 473, 475, 477, 479 and 481 is fastened to the opposite end wall of chamber 397 from the first assembly, and the ends of support shafts 465 and 467 opposite the ends fastened in block 481 are fastened in the support block of assembly 483 (See FIG. 8B). Shafts 465 and 467 thus form a rectangular assembly with support blocks at each end, slidable vertically on four vertical guide shafts.

An opening through the end wall of chamber 397 just above bracket 471 has a rotary vacuum feedthrough 485 mounted to the outside, through which rotary air cylinder 487, mounted on bracket 489, turns shaft 491. Shaft 491 extends for the length of chamber 397 and passes above bracket 471 and block 481 of FIG. 8D, and also between the similar bracket and block of elevator assembly 483 on the end wall opposite bracket 471 and block 481. There are two eccentric cams on shaft 491, cam 493 and cam 495. Cam 493 is on shaft 491 just under block 481, and supports block 481. Cam 495 is on shaft 491 under the equivalent block of elevator assembly 483. Cam shaft 491 is supported in bearing blocks 497 and 499 on the opposite inside end walls of chamber 397. Rotary air cylinder 487 turns shaft 491 between a position where both cams 493 and 495 are at their minimum radius vertically, and a position where both are at their maximum radius vertically. When the cams are at the maximum radius position, block 481 and the corresponding block of assembly 483 are lifted, lifting shafts 465 and 467, and hence load arm 449, so a cassette is lifted above surface 469. When the cams are at the minimum radius position the shaft support blocks are lowered, lowering shafts 465 and 467, hence arm 449, and a cassette is set down and released to surface 469.

To move a cassette from the entrance air-lock at position 447 to a position 501 on platen 399 in chamber 397, linear horizontal motion is required of arm 449 after lifting a cassette at air-lock position 447. This movement is provided by a worm screw 503 running the length of chamber 397 above the level of shafts 465 and 467. Worm screw 503 passes through a worm screw nut 505 that mounts in a slotted bracket 507 which is in turn fastened to block 459 by conventional screw fasteners. Worm screw 503 is supported by bearing blocks 509 and 511 on the opposite inside end walls of chamber 397, and is turned by motor 513 mounted on outside bracket 515, operating through rotary feedthrough 517. Nut 505 travels along worm screw 503 as the worm screw turns and the slotted, grooved attachment to bracket 507 causes block 459, hence 449, to follow. Vertical motion of block 459 is allowed by the fact that the sides of slotted bracket 507 fit into grooves in the worm screw nut assembly.

Once a cassette of workpieces is placed in chamber 415, door 419 is closed and latched, the chamber is exhausted and gate valve 411 is opened, worm screw 503 may be turned moving the cantilevered extension of arm 449 into the air-lock. This is done with the elevator at the low position so ledges 455 and 457 pass under rim 453 of the cassette. Once in position, rotary air cylinder 487 may be activated, lifting the cassette by rim 453. Worm screw 503 is then turned to move arm 449 with the cassette out of the air-lock, through the gate valve, and into chamber 397. Once the cassette clear gate valve 411, the gate may close, and air-lock 415 may be vented to place another cassette of unfinished workpieces into the chamber. Inside chamber 397, platen 399 is moved to position 443 and arm 449 is manipulated to place the cassette on platen 399 at position 501.

There are two positions on platen 399, a first position 519 and a second position 521. The cassette shown in position 501 in chamber 397 is placed on platen position 519. Assuming a previous cassette was loaded, and is in position 521 on platen 399, workpieces may be loaded to and from the door of chamber 29 by the vertical load slide acting through platen 399 and through slots in the cassettes. Once the last workpiece from the cassette at position 521 is loaded, a next workpiece is loaded from the first slot in the cassette at position 519 and so forth, avoiding interruption. When the last workpiece from the cassette at position 521 is returned to its slot, having been processed, that cassette may be moved into exit-lock 417. A second cantilevered load arm 523 is provided to move cassettes into the exit air-lock. This load arm is similar to entrance load arm 445, and the elevator, guides and drives are also similar. Space within chamber 397 does not allow the two load arms to travel on the same guide shafts or to share the same elevator or linear drive, because they do not operate always at the same time, and length of stroke requirements would cause one to interfere with the other.

Figure 8E:
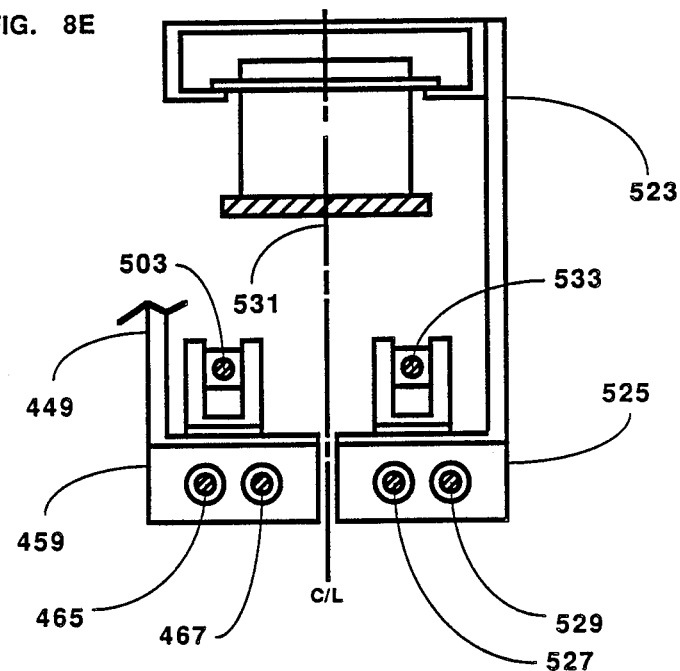
FIG. 8E is another section from FIG. 8B.

FIG. 8E is a view through section C—C from FIG. 8B, showing the arrangement of exit load arm 523 and associated equipment. Arm 523 is like arm 449 except the vertical support is from the opposite side, toward the dial center, and the arm is fastened to a bearing block 225 that rides on two shafts, 527 and 529, that are assembled in chamber 397 at the same height as shafts 465 and 467, but beside those shafts toward the center of the dial. Block 459 with shafts 465 and 467 are shown in FIG. 8E to provide the spatial relationship between the two sets. Centerline 531 of FIG. 8C and 8E are the same centerline. There is a worm screw 533 for moving arm 523 along shafts 527 and 529, and another motor drive and rotary feedthrough for rotating worm screw 533. The feedthrough and motor and other associated equipment are beside those for worm screw 503 and not seen in FIG. 8B, being to the rear in that view.

Figure 8F:
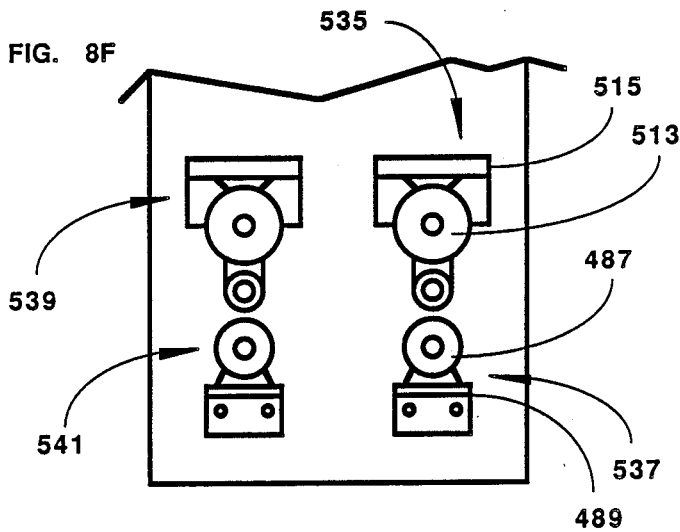
FIG. 8F is a partial side view of FIG. 8B.

FIG. 8F is a view through section D—D from FIG. 8B showing the spatial relationship of drives for the manipulation of load arms 449 and 523. Assembly 535, including bracket 515 and motor 513 is the drive for worm screw 503 that provides horizontal linear motion for entrance load arm 449. Assembly 539 is a duplicate of assembly 535, and drives worm screw 533 to provide linear motion for arm 523. Assembly 537, including bracket 489 and rotary air cylinder 487 rotates camshaft 491 to provide vertical movement for entrance arm 449 through the elevator arrangements illustrated by FIG. 8D. Assembly 541 is a duplicate of assembly 537, and provides the vertical movement for exit load arm 523 through elevator mechanisms associated with shafts 527 and 529, which are duplicates of those for shafts 465 and 467.

Drive assemblies 535, 537, 539 and 541 are separately controlled by the digital control system in response to sensors and switches (not shown) indicating the status of equipment and positions of cassettes and workpieces in the system, and the control sequence follows programmed logic.

Once a cassette at position 521 in platen 399 has a last workpiece returned, during the next process cycle platen 399 is moved to end position 445, gate valve 413 is opened, exit air-lock 417 having been previously pumped, and exit load arm 523 is manipulated by means of the external drives illustrated, to pick up the finished cassette at positions 521 on the platen and move it into exit air-lock 417. The cassette is lowered to the pedestal in the air-lock and arm 523 withdraws. Valve 413 closes, vent valve 441 opens, venting the exit air-lock, and door 429 may be opened to retrieve the cassette of finished workpieces, after which the door is closed and latched, and the chamber is again exhausted to await the next finished cassette.

After the exit cassette transfer, inside chamber 397 under vacuum, either load arm may be used in conjunction with movement of platen 399 to transfer the cassette at position 519 on the platen to position 521, and production continues. Before workpieces are exhausted from the cassette at positions 521, during a process cycle, a new cassette is retreived from entrance air-lock 415 so production may continue.

There is, as will be aware to those skilled in the art of designing and manufacturing equipment for material transport, a broad range of sequences and timing that may be programmed and used to provide an air-lock system for cassettes of workpieces to be moved into and out of chamber 397, some of which interrupt production for short periods, and some of which do not interrupt production at all. The design illustrated above provides maximum flexibility in application. There are also many changes that may be made in the design of mechanisms and components of the in-line cassette air-lock system without departing substantially from the spirit and scope of the design.

What is claimed is:

1. A system for moving and processing workpieces comprising:

a main baseplate forming a fixed horizontal framing element of said system, having a central hole therethrough and two or more vertical passages therethrough, said vertical passages arranged at repeating angular intervals on the circumference of a circle with its center located within said central hole, said main baseplate having a substantially flat upper surface in proximity of said vertical passages;

a plurality of individual stations equal in number to the number of said vertical passages, with one of each of said stations sealed to a bottom surface of said main baseplate at each of said vertical passages, each individual station having an opening with each opening aligned with a different one of said vertical passages, one of said individual stations being an air-lock, the others being processing stations;

a vertical centerpost passing through said central hole of said main baseplate;

a turret of substantially the diameter of the locus of said vertical passages through said main baseplate, said turret fixedly attached to the center post and concentric with it;

a plurality of carrier assemblies, equal in number to the number of individual stations, said carrier assemblies configured to hold a workpiece vertically in a plane with the aid of gravity, each of said carrier assemblies attached to said turret and extending therebelow in a circular pattern congruent with the pattern of said vertical passages through said main baseplate;

means for moving said center post vertically between a lowermost position at which workpieces on said carrier assemblies are fully inserted through said vertical passages and into said individual stations, and an uppermost position at which workpieces on said carrier assemblies are fully withdrawn from said vertical passages and above the upper surface of said main baseplate;

means for indexing said center post rotationally at said upperemost position by an angular increment equal to the angular increment between said vertical passages through said main baseplate relative to said centerpost;

a sealable door opening from said one of said individual stations used as an air-lock;

a workpiece cradle attached to an inside surface of said air-lock door, said cradle being configured to hold a workpiece vertically with the aid of gravity and in the same plane as a workpiece held by one of said carrier assemblies, such that a workpiece entering said air-lock through said vertical passage will transfer from said carrier assembly to said door cradle, and a workpiece in said door cradle will transfer to said carrier assembly as said carrier leaves said air-lock through said vertical passage;

a plurality of pedestals, equal in number to the number of individual stations used as process stations, one said pedestal attached to an inner wall of each said process station, each pedestal configured to hold a workpiece substantially vertically with the aid of gravity and in substantially the same plane as a workpiece held by one of said carrier assemblies, such that a workpiece entering one of said process stations through one of said vertical passages will transfer from said carrier assembly to said process pedestal, and a workpiece on said process pedestal will transfer to said carrier assembly as said carrier leaves said process station through said vertical passage, the workpiece being supported on said pedestals during processing; and an hermetic dome sealed to said main baseplate, said baseplate and said dome forming a main chamber enclosing said center post, turret and carrier assemblies;

said turret with said carrier assemblies being lifted, indexed and lowered by said center post moving means and indexing means, said lifting, indexing, and lowering for engaging and lifting workpieces from said door cradle and process pedestals and for transferring said workpieces through said main chamber and into the next individual chamber in the direction of indexing, the workpieces being lifted simultaneously from all said pedestals and cradles and indexed and placed simultaneously.

2. A system for moving and processing workpieces as in claim 1 wherein said carrier assemblies comprise two vertical arms spaced apart a distance greater than the width of a workpiece, and two grooved supports spaced apart less than the width of a workpiece, said grooved supports being attached one each to the lower end of each of two said vertical arms, grooves facing such that a workpiece may be supported vertically having a small edge portion engaged in the groove of each said grooved support, said workpiece then being disposed between said vertical arms.

3. A system for moving and processing workpieces as in claim 2 wherein said door cradle on said air-lock door comprises two grooved elements spaced apart less than the distance of the spacing of said two grooved supports of said carrier assemblies, such that with said door closed on said air-lock, and with a carrier assembly fully inserted onto said air-lock, a workpiece supported on said door cradle will be in a common plane with the grooves of said grooved supports of said carrier assembly, and said workpiece will be a short distance above but not touching said grooved supports of said carrier assembly.

4. A system for moving and processing workpieces as in claim 3 wherein said pedestals in said processing chambers are angled a small amount from vertical and include on each pedestal two workpiece support members at substantially the height and spacing of said support elements forming the cradle on said air-lock door, said support members angled such as to cause a workpiece transferring thereto from a lowering carrier assembly to tilt toward the angled face of said pedestal and hence to lie flat on said pedestal face.

5. A system for moving and processing workpiece as in claim 3 wherein said pedestals in said processing chambers include two workpiece support members at substantially the height and spacing of said support elements forming the cradle on said air-lock door, said support members mounted to one or more side walls or to a bottom wall of said processing chamber in a manner such that a relatively thin and flat workpiece is supported vertically by said support member, and neither face of said workpiece is occluded or shadowed, and both opposite faces of said workpiece are substantially presented for processing to opposite sides of said processing chamber.

6. A system for moving and processing workpieces as in claim 1 further comprising sealing means associated with said baseplate for effecting a seal at each said vertical passage through said baseplate as said turret assembly reaches the lowermost position, thereby sealing each process station from said main chamber and from each other process chamber.

7. A system for moving and processing workpieces as in claim 6 wherein said sealing means is an O-ring in a groove, said groove being in said main baseplate, one such groove and O-ring surrounding each said vertical passage.

8. A system for moving and processing workpieces as in claim 1 wherein said means for moving said center post vertically is a bell-crank mechanism operating on said central post from a position below said baseplate.

9. A system for moving and processing workpieces as in claim 8 wherein said means for indexing said center post rotationally comprises a Geneva wheel mechanism with a number of positions equal to the number of individual stations.

10. A system for moving and processing workpieces as in claim 9 further comprising a first sealed rotary motion feedthrough mechanism through a wall of said system for rotating said Geneva wheel.

11. A system for moving and processing workpieces as in claim 10 further comprising a second sealed rotary motion feedthrough mechanism through a wall of said system for rotating said bell-crank mechanism.

12. A system for moving and processing workpieces as in claim 1 further comprising a second baseplate spaced below said main baseplate, said stations sealed to the underside of said main baseplate being disposed above said second baseplate, said second baseplate having a pluraltiy of openings equal in number to the number of stations, each station having an opening sealed also to said openings through said second baseplate;

said system further comprising vacuum pumping means connected below said second baseplate, said vacuum pumping means for evacuating said processing stations through said openings in said second baseplate.

13. A system for moving and processing workpieces as in claim 1 wherein said main baseplate has at least one radial hole at each process station position, said radial hole intersecting said vertical passages through said main baseplate, each of said radial holes configured for mounting of one of either process gas supplies and process monitoring transducers such that process stations may be demounted without disconnecting said gas supplies and transducers.

14. A system for moving and processing workpieces as in claim 13 wherein said main baseplate also has at least one vertical hole therethrough at each process station position, said vertical holes being located toward the center of said center post from said vertical passages, and intersecting with said radial holes, said radial holes passing through said baseplate to said vertical passages;

said system further comprising pumping means connected to the main chamber for pumping the main chamber and for pumping said process chambers through said vertical holes by way of said radial holes and said vertical passages.

15. A system for moving and processing workpieces as in claim 13 wherein said main baseplate also has at least one vertical hole therethrough at each process station position, said vertical holes being located toward the center of said centerpost from said vertical passages, and intersecting with said radial holes, said radial holes passing through said baseplate to said vertical passages;

said system further comprising a plurality of pumping means, with each of said pumping means dedicated to a different one of said processing stations and connected thereto from below through said vertical holes.

16. A system for moving and processing workpieces as in claim 1 further comprising pumping means, gas supply means, monitoring means and processing means which are dedicated at each of said process stations, for performing processes in each process station independent of the processes being performed in the other process stations.

17. A system for moving and processing workpieces as in claim 16 wherein at least one of said process stations comprises chemical vapor deposition apparatus and at least one of said process stations comprises sputtering apparatus.

18. A system for moving and processing workpieces as in claim 1 wherein said carrier assemblies include means for lateral movement such that workpieces may be placed upon said pedestals and said carrier assemblies may be withdrawn;

said system further comprising sealing means activated by independently operated vacuum valves located at each of said vertical passages through said main baseplate serving each said processing station, so that processing can be performed with said carrier assemblies in said main chamber.

19. A system for moving and processing workpieces as in claim 18 wherein said turret consists of a single radial arm from said center post, said radial arm having a single carrier assembly, said means for indexing said center post indexable in either radial direction, providing for transferring workpieces optionally from any one station to any other station as desired for process sequence, said carrier residing in said main chamber during processing.

20. A system for moving and processing workpieces as in claim 18 further comprising means for automatically loading workpieces from a cassette of workpieces to said door cradle and automatically unloading processed workpieces from said door cradle back to said cassette.

21. A system for moving and processing workpieces as in claim 20 wherein said loading and unloading means is enclosed in a vacuum chamber, said chamber having opening means for placing said cassettes into and for withdrawing said cassette of workpieces from said vacuum chamber;

said system further comprising rough pumping means and high vacuum pumping means for creating a first vacuum level and a second vacuum level, respectively, in said system.

22. A system for moving and processing workpieces as in claim 21 wherein said opening means comprises two openings;

said system further comprising two vacuum gate valves with one of each of said gate valves sealed to each of said openings;

said system further comprising two cassette lock chambers with one of each of said lock chambers sealed to each of said vacuum gate valves, each lock chamber connected to said rough pumping means;

said system further comprising venting means for venting said lock chambers;

said opening means further comprising an opening for passing a cassette of wafer in or out while such chamber is vented;

said load and unload means also including means for transporting cassettes from chamber to chamber through said gate valves when said gate valves are open, one of said locks being used as an entrance lock for cassettes and the other being used as an exit lock for cassettes, so that the system can be continuously loaded and unloaded, and processing can be carrier out while air locking cassettes in and out.

23. A system for moving and processing workpieces as in claim 18 including means for automatically loading workpieces from a cassette of workpieces to said door cradle and automatically unloading processed workpieces from said door cradle back to said cassette.

24. A system for moving and processing workpieces as in claim 18 wherein said loading and unloading means is enclosed in a vacuum chamber, said chamber having an opening for placing and withdrawing cassettes of workpieces, rough pumping means and high vacuum pumping means.

25. A system for moving and processing workpieces as in claim 18 wherein said vacuum chamber enclosing load and unload means has an opening at each end, a vacuum gate valve is sealed to each said opening, and a cassette lock chamber is sealed to each said gate valve, each lock chamber having rough pumping means and venting means, and an opening for passing a cassette of wafers in or out while such chamber is vented, said load and unload means also including means for transporting cassettes from chamber to chamber, through said gate valves when open, one of said locks being used as an entrance lock for cassettes and the other as an exit lock for cassettes, providing ability to continuously load, unload and process while air locking cassettes in and out.

26. A system for moving and processing workpieces as in claim 1 further comprising means for automatically loading workpieces from a cassette of workpieces to said door cradle and automatically unloading processed workpieces from said door cradle back to said cassette.

27. A system for moving and processing workpieces as in claim 26 further comprising a vacuum chamber with said loading and unloading means enclosed therein, said vacuum chamber having opening means or placing and withdrawing cassettes of workpieces from said vacuum chamber;

said system further comprising rough pumping means and high vacuum pumping means for creating a first vacuum level and a second vacuum level respectively, in said system.

28. A system for moving and processing workpieces as in claim 27 wherein said opening means comprises two openings;

said system further comprising two vacuum gate valves with one of each of said gate valves sealed to each of said openings;

said system further comprising two cassette lock chambers with one of each of said lock chambers sealed to each of said vacuum gate valves, each lock chamber connected to said rough pumping means;

said system further comprising venting means for venting said lock chambers;

said opening means further comprising an opening for passing a cassette of wafers in or out while such chamber is vented;

said load and unload means also including means for transporting cassettes from chamber to chamber through said gate valves when said gate valves are open, one of said locks being used as an entrance lock for cassettes and the other being used as an exit lock for cassettes, so that the system can be continuously loaded and unloaded, and processing can be carried out while air locking cassettes in and out.

29. A system for moving and processing workpieces comprising:

baseplate means for providing a fixed horizontal framing element for said system, said baseplate means having a central hole therethrough and a plurality of vertical passages therethrough, said vertical passages arranged at repeating angular intervals on the circumference of a circle having its center located with said hole, said baseplate means having a substantially flat upper surface in proximity of said vertical passages and a bottom surface;

a plurality of individual stations equal in number to the number of said vertical passages, with one of each of said stations sealed to said bottom surface of said baseplate means at each of said vertical passages, each individual station having an opening for receiving a workpiece which is aligned with its respective vertical passage;

a vertical center post passing through said central hole of said baseplate means and extending above said upper surface, said center post having its center at the center of the circle defined by said vertical passages;

turret means fixedly attached to said center post and rotatable therewith, for holding at least one workiece at a radial distance from the center of said center post that is equal to the radius of the circle defined by said vertical passages;

a dome hermetically sealed to said baseplate means, said dome and said baseplate means forming a main pressure vessel enclosing the center post and turret means;

elevator means for moving said center post and turret means vertically between a lowermost position at which said workpiece would be fully inserted through any one of said vertical passages and into a corresponding one of said individual stations and an uppermost position at which said workpiece would be fully withdrawn from any one of said vertical passages and out of said corresponding individual station;

indexing means for rotating said center post and turret means through angular increments which are multiples of the angular increment between said vertical passages relative to said centerpost;

pump means for controlling the pressure inside said pressure vessel and inside said stations.

30. A system as in claim 29 wherein said turret means comprises a frame for attaching said turret means to said center post and a plurality of carrier assemblies attached to said frame and depending therefrom, each of said carrier assemblies configured for holding a workpiece having a substantially planar shape in a substantially vertical orientation at said radial distance from said center post, said carrier assemblies having an angular increment therebetween relative to said center post that is equal to the angular increment between stations.

31. A system for moving and processsing workpieces as in claim 29 further comprising processing means at said individual stations for performing processes in any one of said individual stations independent of processes performed in other of said individual stations.

32. A system for moving and processing workpieces as in claim 31 wherein at least one of said individual stations comprises chemical vapor deposition apparatus and at least one of said individual stations comprises sputtering apparatus.

33. A system for moving and processing workpieces as in claim 29 wherein said turret means further comprises transfer means for placing and retreiving said at least one workpiece in and from said individual stations, and individually operated sealing means at each of said vertical passages, such that a workpiece may be placed into or retrieved from any one of said individual stations with said sealing means open, and a workpiece may reside in an individual station with said turret assembly in said main chamber and said individually operated sealing means sealed.

* * * * *